United States Patent
Yabuuchi et al.

(10) Patent No.: US 10,705,143 B2
(45) Date of Patent: Jul. 7, 2020

(54) CONTENT ADDRESSABLE MEMORY

(71) Applicant: Renesas Electronics Corporation, Tokyo (JP)

(72) Inventors: Makoto Yabuuchi, Tokyo (JP); Shinji Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 125 days.

(21) Appl. No.: 15/916,016

(22) Filed: Mar. 8, 2018

(65) Prior Publication Data

US 2018/0340978 A1 Nov. 29, 2018

(30) Foreign Application Priority Data

May 24, 2017 (JP) .................. 2017-103137

(51) Int. Cl.
| | |
|---|---|
| G01R 31/00 | (2006.01) |
| G01R 31/3177 | (2006.01) |
| G11C 15/04 | (2006.01) |
| G06F 11/27 | (2006.01) |
| G06F 11/00 | (2006.01) |
| G11C 29/12 | (2006.01) |

(52) U.S. Cl.
CPC .......... *G01R 31/3177* (2013.01); *G06F 11/27* (2013.01); *G11C 15/04* (2013.01); *G11C 29/12* (2013.01)

(58) Field of Classification Search
None
See application file for complete search history.

(56) References Cited

U.S. PATENT DOCUMENTS

| | | | |
|---|---|---|---|
| 7,428,682 B2 | 9/2008 | Aihara et al. | |
| 2009/0190404 A1* | 7/2009 | Roohparvar | G11C 15/046 365/185.17 |
| 2013/0242632 A1* | 9/2013 | Wada | G11C 15/02 365/49.17 |
| 2016/0179261 A1* | 6/2016 | Drumm | G06F 3/042 345/175 |
| 2018/0025755 A1* | 1/2018 | Miki | G06F 3/0683 711/100 |

FOREIGN PATENT DOCUMENTS

JP 2006-236515 A 9/2006

* cited by examiner

*Primary Examiner* — Justin R Knapp
(74) *Attorney, Agent, or Firm* — McDermott Will & Emery LLP

(57) ABSTRACT

An object of the present invention is to provide a highly-reliable content addressable memory. Provided is a content addressable memory including: a plurality of CAM cells; a word line joined to the CAM cells; a plurality of bit lines joined to the CAM cells; a plurality of search lines joined to the CAM cells; a match line joined to the CAM cells; a match amplifier joined to the match line; and a selection circuit that can select the output of the match amplifier in accordance with the value of the word line.

12 Claims, 13 Drawing Sheets

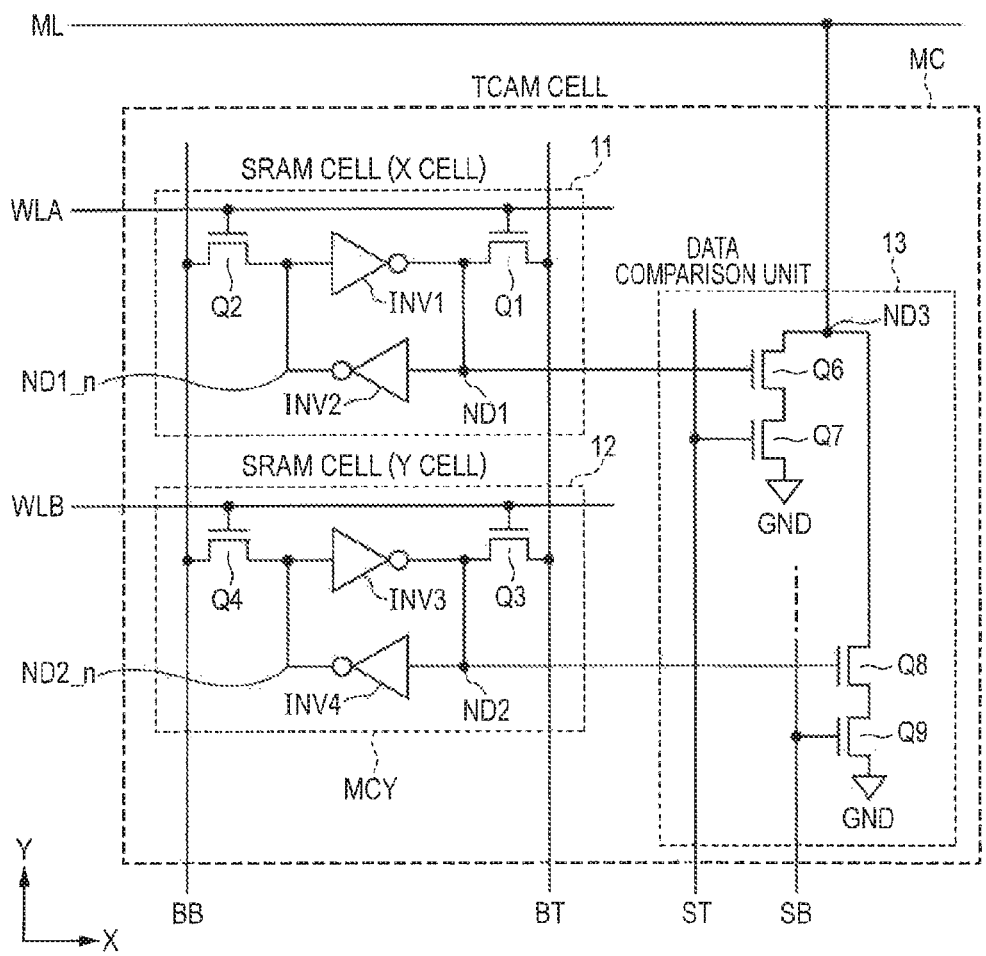

US 10,705,143 B2

CONTENT ADDRESSABLE MEMORY

CROSS-REFERENCE TO RELATED APPLICATIONS

The disclosure of Japanese Patent Application No. 2017-03137 filed on May 24, 2017 including the specification, drawings and abstract is incorporated herein by reference in its entirety.

BACKGROUND

The disclosure relates to a content addressable memory, and can be particularly applied to a content addressable memory that can be incorporated into a semiconductor device and a semiconductor device incorporating a content addressable memory.

A data word (entry) matching a search word (search data) is searched for among those stored in a storage device car led an associative memory or a CAM (Content Addressable Memory). In the case where the word data matching the search word can be found, the address thereof is output.

As the CAM, there are a BCAM (Binary CAM) and a TCAM (Ternary CAM). Each memory cell of the BCAM stores information of either "0" or "1". On the other hand, each memory cell of the TCAM can store information of not only "0" and "1" but also "Don't Care". The "Don't Care" indicates that either of "0" and "1" may be stored.

A TCAM device using the TCS has been widely used for address search and access control in a router for a network such as the Internet.

Japanese Unexamined Patent Application Publication No. 2006-236515 discloses a test technique of a CAM macro.

SUMMARY

In the case of developing and providing a highly-reliable TCAM macro cell that can be incorporated into a semiconductor device, it is desirable that a TCAM macro cell can be relatively easily tested without extremely increasing circuit configurations for the test and the number of wirings.

An object of the disclosure is to provide a highly-reliable content addressable memory.

The other objects and novel features will become apparent from the description of the specification and the accompanying drawings.

The following is a representative summary of the disclosure.

Specifically, a content addressable memory includes: a plurality of CAM cells; a word line joined to the CAM cells; a plurality of bit lines joined to the CAM cells; a plurality of search lines joined to the CAM cells; a match line joined to the CAM cells; a match amplifier joined to the match line; and a selection circuit that can select the output of the match amplifier in accordance with the value of the word line.

According to the above-described semiconductor device, it is possible to provide a highly-reliable content addressable memory.

BRIEF DESCRIPTION OF THE DRAWINGS

FIG. 2 is a circuit diagram for showing an example of a configuration of a TCAM cell according to an example;

FIG. 3 is a diagram for showing correspondences between contents stored in an X cell and a Y cell of FIG. 2 and data of the TCAM cell in a table format;

DETAILED DESCRIPTION

The inventors considered a configuration in which a test of quality determination of a search function is conducted by detecting the level of a match line ML in a CAM that can be incorporated into a semiconductor device.

Figure 1:
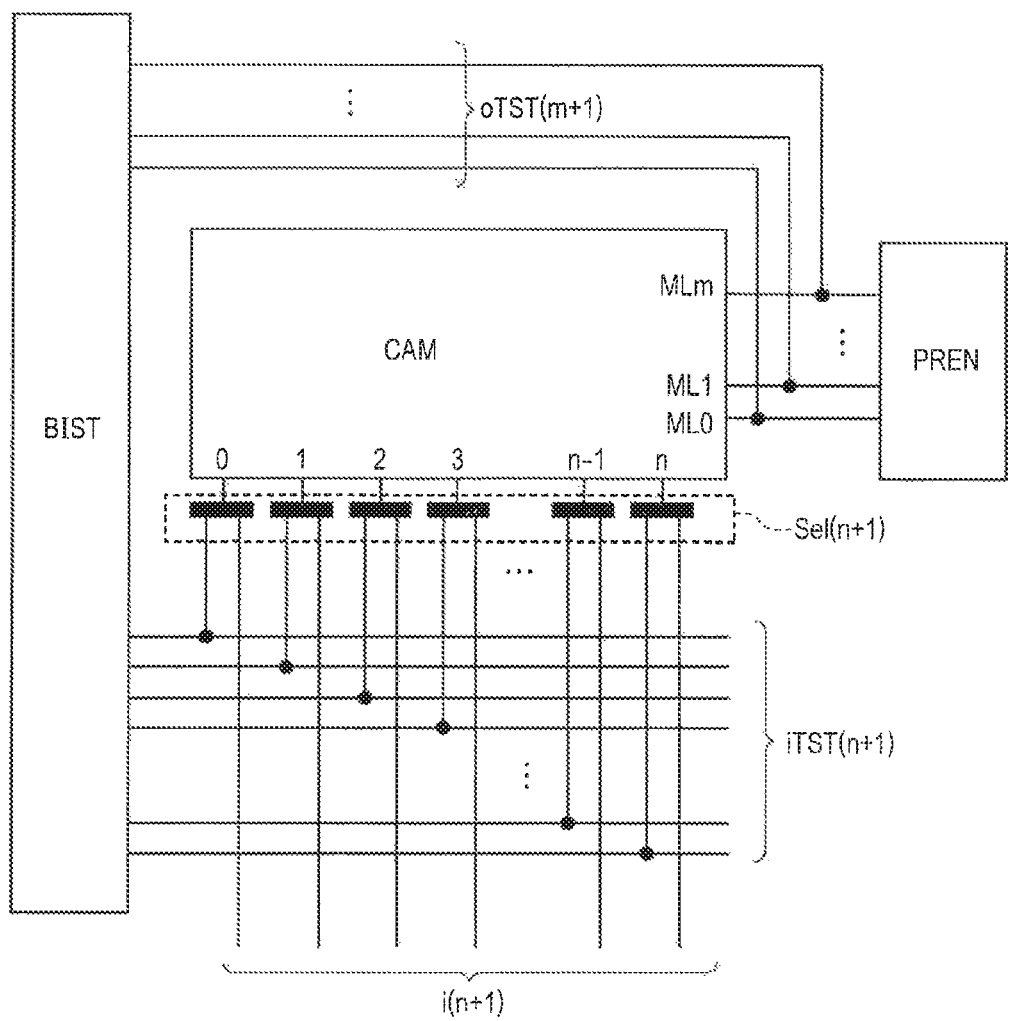
FIG. 1 is a diagram for describing problems of a test of a CAM.

The CAM has match lines the number of which is equal to that of entries. In the case where a test of the search function of the CAM is conducted, search data input for the test and all the entries are compared to each other, and it is necessary to determine whether or not the output value of each match line is an expected value. The number of combinations of the data values of all the entries and plural pieces of search data is extremely enormous, and the number of combinations of the expected values of all the match lines is accordingly enormous. FIG. 1 is a conceptual diagram of a test configuration for describing problems of the test of the CAM, which was considered by the inventors. FIG. 1 illustrates an incorporated self-test circuit BIST, a CAM, a priority encoder PREM, and connection wirings provided therebetween. In FIG. 1, the CAM has m+1 entries having n+1 bits, and match lines ML0-MLm are provided in association with the m+1 entries. The incorporated self-test circuit BIST needs to be coupled to n+1 test data supply wirings ITST (n+1) for inputting test search data into the CAM and m+1 test result wirings oTST (m+1) for receiving test results from the match lines ML0-MLm of the CAM. Further, n+1 selection circuits Sel (n+1) are provided. The selection circuits Sel (n+1) select the test data supply wirings iTST (n+1) at the time of the test operation, and select n+1 normal input wirings i (n+1) at the time of the normal operation. In this configuration, the number of wirings (the number (2+n+m) obtained by adding the n+1 test data supply wirings iTST (n+1) to the m+1 test result wirings oTST (m+1)) is extremely large, and the wiring property is poor. Therefore, the configuration of FIG. 1 is not suitable for being incorporated into a semiconductor device.

Hereinafter, embodiment, example, modified examples, and an application will be described using the drawings. However, the same constitutional elements are followed by the same signs in the following description, and the repeated explanation thereof will be occasionally omitted. It should be noted that the width, shape, and the like of each unit are schematically shown in the drawings in some cases as compared to the actual mode in order to more clarify the explanation. However, these are only examples, and do not limit the interpretation of the present invention.

Embodiment

In the embodiment, the configuration is as follows.
1) A search result is output by selecting a corresponding match line in synchronization with the selection of an entry to be tested at the time of searching in a test operation. The corresponding match line is selected by a match line selection circuit. The match line selection circuit selects the corresponding match line in accordance with the selection level of a word line of the entry to be tested. In the case where the entry is stored using a TCAM cell, the match line selection circuit selects the corresponding match line when one of two word lines becomes the selection level.
2) Test search data is input into a search line using a scan input circuit. The test search data, is data so as to cause a 1-bit mistake with respect to the storage data of the entry to be tested. The test search data causing a 1-bit mistake is shifted by the scan input circuit after a search test for all the entries to be tested is conducted, and the search test for all the entries to be tested is conducted again using new test search data.

According to the embodiment, the match line is selected in accordance with the level of the word line, and the test result is output. Therefore, the number of test signal wirings to output the test result can be reduced, and the wiring property can be improved. Further, since the test search data is input by the scan input circuit, the number of test signal wirings to input the test data (test search data) can be reduced, and the wiring property can be improved.

EXAMPLE

[Configuration of TCAM Cell]

FIG. 2 is a circuit diagram for showing an example of a configuration of a TCAM cell according to an example. With reference to FIG. 2, a TCAM cell (also referred to as a memory cell MC or a bit cell) includes two SRAM cells (Static Random Access Memory Cells) 11 and 12 and a data comparison unit 13. The SRAM cell 11 is also referred to as an X cell, and the SRAM cell 12 is also referred to a Y cell. The X cell 11 stores pieces of 1-bit complementary data (when one data is "1", the other is "0") in a pair of storage nodes ND1 and ND1_$n$ inside the X cell 11. The Y cell 12 stores pieces of 1-bit complementary data in a pair of storage nodes ND2 and ND2_$n$ inside the Y cell 12.

The TCAM cell is coupled to a pair of bit lines BT and BB, a pair of search lines ST and SB, a match line ML, and word lines WLA and WLB. The pair of bit lines BT and BB extends in the column direction (Y direction) of a TCAM cell array 20 of FIG. 4, and is shared by a plurality of TCAM cells arrayed in the column direction. The pair of search lines ST and SB extends in the column direction (Y direction) of the TCAM cell array 20, and is shared by the TCAM cells arrayed in the column direction.

The match line ML extends in the row direction (X direction) of the TCAM cell array 20, and is shared by the TCAM cells arrayed in the row direction. The word lines WLA and WLB extends in the row direction (X direction) of the TCAM cell array 20, and is shared by the TCAM cells arrayed in the row direction. The word lines WLA and WLB can be also referred to as a first word line and a second word line.

The X cell 11 includes inverters INV1 and INV2 and N-channel MOS (Metal Oxide Semiconductor) transistors Q1 and Q2. The inverter INV1 is coupled between the storage node ND1 and the storage node ND1_$n$ so that the direction from the storage node ND1_$n$ to the storage node ND1 becomes the forward direction. The inverter INV2 is coupled in parallel with and in the backward direction of the INV1. The MOS transistor Q1 is coupled between the storage node ND1 and the bit line BT. The MOS transistor Q2 is coupled between the storage node ND1_$n$ and the bit line BB. The gates of the MOS transistors Q1 and Q2 are coupled to the word line WLA.

The Y cell 12 includes inverters INV3 and INV4 and MOS (Metal Oxide Semiconductor) transistors Q3 and Q4. The inverter INV3 is coupled between the storage node ND2 and the storage node ND2_$n$ so that the direction from the storage node ND2_$n$ the storage node ND2 becomes the forward direction. The inverter INV4 is coupled in parallel with and in the backward direction of the INV3. The MOS transistor Q3 is coupled between the storage node ND2 and the bit line BT. The MOS transistor Q4 is coupled between the storage node ND2_$n$ and the bit line BB. The gates of the MOS transistors Q3 and Q4 are coupled to the word line WLB.

The data comparison unit 13 includes N-channel MOS transistors Q6 to Q9. The MOS transistors and Q7 are coupled in series between a node ND3 that is a connection point with the match line ML and a ground node GND. The MOS transistors Q8 and Q9 are coupled in series between the node ND3 and the ground node GND, and are coupled in parallel with the entirety of the MOS transistors Q6 and Q7 that are coupled in series. The gates of the MOS transistors Q6 and Q8 are coupled to the storage nodes ND1 and ND2, respectively. The gates of the MOS transistors Q7 and Q9 are coupled to the search lines ST and SB, respectively.

It should be noted that a BCAM memory cell can be configured in such a manner that, as shown in, for example, FIG. 2, the word line WLB and the Y cell are deleted and the gate electrode of the MOS transistor Q8 is coupled to the storage node ND1_$n$ of the X cell.

FIG. 3 is a diagram for showing correspondences between the contents stored in the X cell and the Y cell of FIG. 2 and the data of the TCAM cell in a table format.

With reference to FIG. 2 and FIG. 3, the TCAM cell can store three kinds of values such as "0", "1", and "x" (don't care) using the 2-bit SRAM cell. Specifically, it is assumed that when "1" is stored in the storage node ND1 of the X cell 11 and "0" is stored in the storage node ND2 of the Y cell 12, "0" is stored in the TCAM cell. It is assumed that when "0" is stored in the storage node ND1 of the X cell 11 and "1" is stored in the storage node ND2 of the Y cell 12, "1" is stored in the TCAM cell. It is assumed that when "0" is stored in the storage node ND1 of the X cell 11 and "0" is stored in the storage node ND2 of the Y cell 12, "x" (don't care) is stored in the TCAM cell. In the case where "1" is stored in the storage node ND1 of the X cell 11 and "1" is stored in the storage node ND2 of the Y cell 12, the TCAM cell is not used.

According to the configuration of the above-described TCAM cell, in the case where the search data is "1" (namely, the search line ST is "1" and the search line SB is "0") and the TCAM data is "0" (the storage node ND1 is "1" and the storage node ND2 is "0"), the MOS transistors Q6 and Q7 are turned on. Thus, the potential of the precharged match line ML is extracted to the around potential. In the case where the search data is "0" (namely, the search line ST is "0" and the search line SB is "1") and the TCAM data is "1" (the storage node ND1 is "0" and the storage node ND2 is "1"), the MOS transistors Q8 and Q9 are turned on. Thus, the potential of the precharged match line ML is extracted to the ground potential. Namely, in the case where the search data and the TCAM data do not match each other, the potential of the match line ML is extracted to the ground potential.

On the contrary, in the case where the input search data is "1" and the TCAM data is "1" or "x", or in the case where the search data is "0" and the TCAM data is "0" or "X" (namely, in the case where the both match each other) the potential (the level of the power supply potential VDD) of the precharged match line ML is maintained.

As described above, in the case of the TCAM, the potential stored in the match line ML is extracted unless the data of all the TCAM cells coupled to the match line ML corresponding to one entry (row) matches the search data.

[Configuration of Array]

Figure 4:
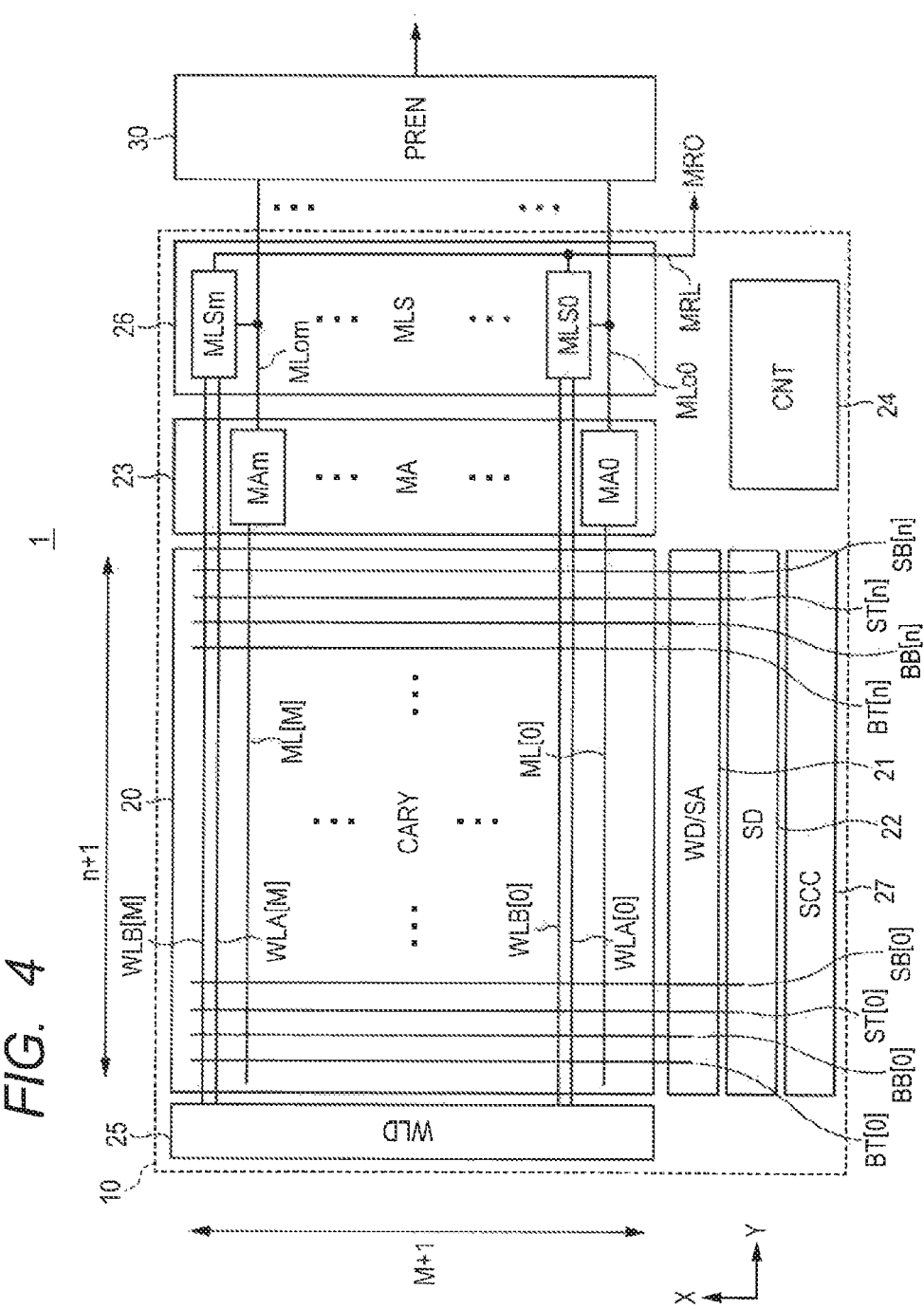
FIG. 4 is a block diagram for showing a configuration of a TCAM device according the example.

FIG. 4 is a block diagram for showing a configuration of a TCAM device according the example. With reference to FIG. 4, the TCAM device 1 includes a TCAM macro cell 10 and a priority encoder (PREN) 30. The TCAM macro cell 10 includes a TCAM cell array (CARY) 20 (also simply referred to as a cell array), a writing driver and reading sense amplifier (WD/SA) 21, a search line driver (SD) 22, a match amplifying unit (NA) 23, a control logic circuit (CNT) 24, and a word line driver (WLB) 25 for driving the word lines WLA and WLB of FIG. 2. The TCAM macro cell 10 further includes a match line selection circuit unit (match line output selection unit) (MLS) 26 for the test and a scan input circuit unit (SCC) 27 for the test.

The cell array 20 includes the TCAM cells arrayed in a matrix manner (M+1 rows; n+1 columns). In the cell array 20, the number of rows (the number of entries) is M+1 (M is a positive integer), and the number of columns (the number of bits of the entry) is n+1 (n is a positive integer).

n+1 pairs of bit lines (BT[0] BB[0]-BT[n], BB[n]) and n+1 pairs of search lines (ST[0], SB[ 0]-ST[n], SB[n]) are provided while corresponding to the respective columns of the cell array 20. M+1 match lines (ML[0]-ML[M]), M+1 word lines (WLA[0]-WLA[M]) for the X cell, and M+1 word lines (WLB[0]-WLB[M]) for the Y cell are provided while corresponding to the respective rows of the cell array 20. The word lines (WLA[0]-WLA[M]) are the first word lines, and the word lines (WLB[0]-WLB[M]) are the second word lines.

The writing driver and reading sense amplifier 21 includes a writing driver WD and a reading sense amplifier SA. The writing driver WD supplies writing data to each TCAM cell through the pairs of bit lines BT and BB at the time of writing. The reading sense amplifier SA amplifies and outputs data read from each TCAM cell through the pairs of bit lines BT and BE at the time of reading.

The search line driver 22 supplies search data to each TCAM cell through the pairs of search lines (ST[0], SB[0]-ST[n], SB[n]) at the time of searching.

The control logic circuit 24 controls the operation of the entire TACM macro cell 10. For example, the control logic circuit 24 controls the operations of the search line driver 22, the match amplifying unit 23, and the precharge circuit at the time of searching by receiving a search command and outputting a control signal to the search line driver 22 and the match amplifying unit 23. The control logic circuit 24 controls the operations of the writing driver WD and the word line driver (WLD) 25 at the time of writing by outputting a control signal to the writing driver WD and the word line driver (WLD) 25. Further, the control logic circuit 24 controls the operations of the word line driver (WLD) 25 and the reading sense amplifier SA at the time of reading by outputting a control signal to the word line driver (WLD) 25 and the reading sense amplifier SA.

The match amplifying unit MA 23 has a plurality of match amplifiers MA0-MAm corresponding to the respective rows of the cell array. The inputs of the match amplifiers MA0-MAm are coupled to the corresponding match lines ML (ML[0]-ML[M]), respectively, and the outputs of the match amplifiers MA0-MAm are coupled to corresponding match signal output lines MLo (MLo0-MLom), respectively. The match amplifiers MA0-MAm generate a detection signal of whether or not the corresponding TCAM cell data matches the corresponding part of the input search data on the basis of the potential of the corresponding match lines ML (ML[0]-ML[M]) at the time of searching, and output the same to the corresponding match signal output lines MLo (MLo0-MLom). In this example, the match amplifiers MA0-MAm include a precharge circuit for precharging the corresponding match lines ML[ 0]-ML[M] at the time of searching.

The match line selection circuit unit (MLS) 26 includes a plurality of match line selection circuits MLS0-MLSm. The respective match line selection circuits MLS0-MASm are coupled to the word lines (WLA[0]-WLA[M], WLB[0]-WLB[M]) corresponding to the respective rows and the match signal output lines (MLo0-MLom) corresponding to the respective rows. The outputs of the respective match line selection circuits MLS0-MLSm are output as match reading signals MR0 through a match reading line (MRL). For example, the match line selection circuit MLS0 is coupled to two word lines (WLA[0], WLB[0]) and one match signal output line MLo0. In the test, test search data for an entry of 0 coupled to two word lines (WLA[0], WLB[0]) and the entry of 0 are searched, and then one of the two word lines (WLA[0], WLB[0]) becomes the selection level. Accordingly, the match signal output line ML0 is selected, and a test output signal corresponding to the signal level of the match signal output line ML0 is output as the match reading signal MR0 through the match reading line (MRL).

The scan input circuit (SCC) 27 for the test is provided to input the test search data in the test. For example, the scan input circuit (SCC) 27 is used to input the search data into the pairs of search lines (ST[0], SB[0]-ST[n], SB[n]) so as to generate a 1-bit mistake for each entry in the test.

The priority encoder (PREN) 30 is provided to select one match signal output line in accordance with a predetermined priority in the case where some of the match signal output lines MLo0-MLom, are at a signal level that indicates matching at the time of searching in the normal operation.

Figure 5:
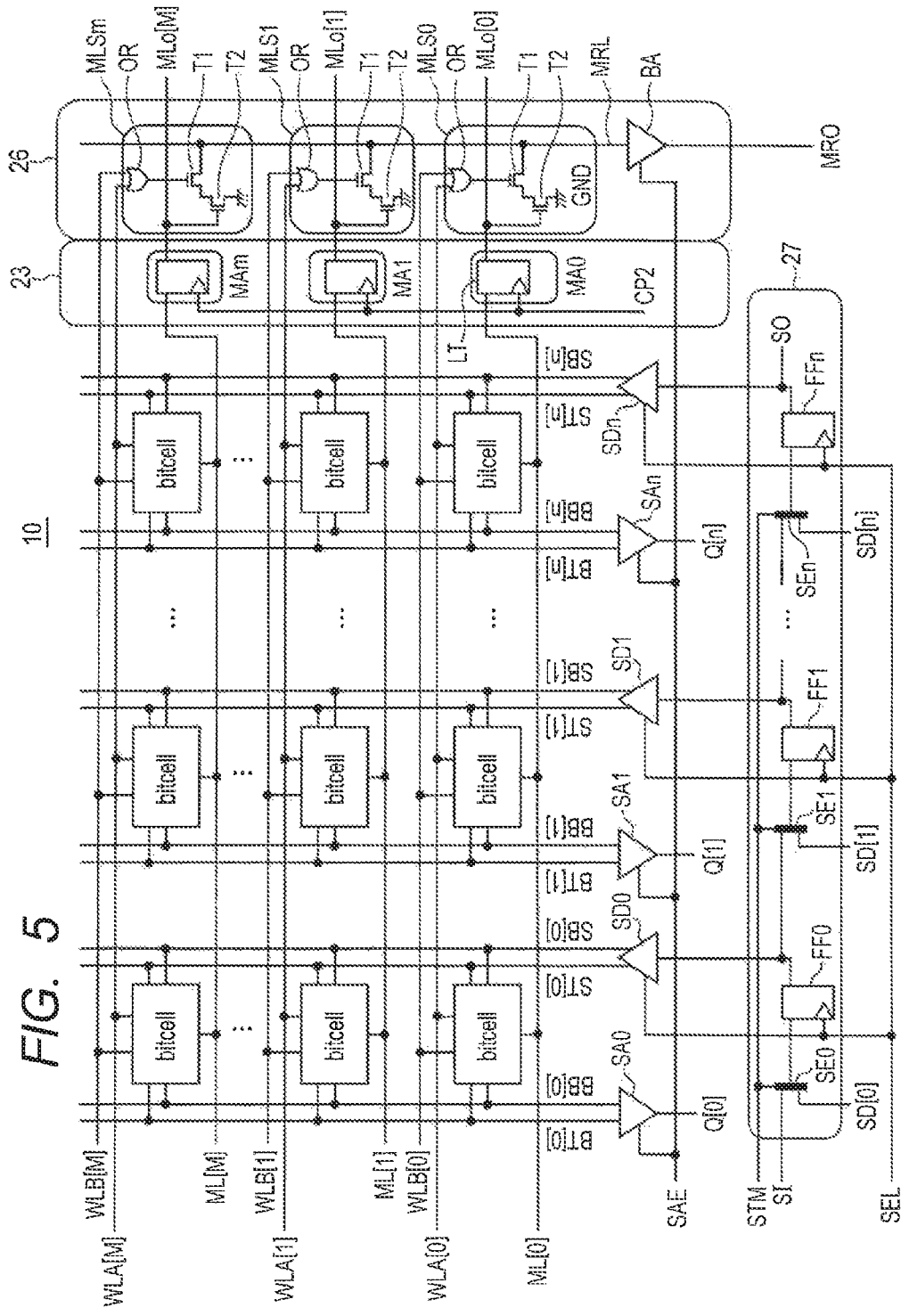
FIG. 5 is a circuit diagram for conceptually showing a TCAM macro cell according to the example.

FIG. 5 is a circuit diagram for conceptually showing the TCAM macro cell according to the example.

The TCAM macro cell 10 has the bit cells (bitcells) arranged in a matrix manner, the pairs of bit lines (BB[0], BT[0]-BB[n], BT[n]), the word lines (WLA[0]-WLA[M] WLB[0]-WLB[M]), the pairs of search lines (ST[0], SB[0]-ST[n] SB[n]), and the match lines (ML[0]-ML[M]).

The TCAM macro cell 10 further has a writing driver WD (omitted in the drawing) for supplying writing data to the pairs of bit lines (BB[0], BT[0]-BB[n] BT[n]), reading sense amplifiers (SA0-SAn), the pairs of search lines (ST[0], SB[0]-ST[n] SB[n]), search line drivers (SD0-SDn) for driving the pairs of search lines (ST[0], SB[0]-ST[n], SB[n]), and the match lines (ML[0]-ML[M]). The operations of the reading sense amplifiers (SA0-SAn) are controlled by a sense amplifier enable signal SAE. The operations of the search line drivers (SD0-SDn) are controlled by a search latch enable signal SLE.

The match lines (ML[0]-ML[M]) are coupled to the match amplifiers (MA0-MAm) in the match amplifying unit 23, respectively. Each of the match amplifiers (MA0-MAm) is provided with a latch circuit LT storing a search result by a latch trigger CP2 as exemplified by the match amplifier MA0. It should be noted that the latch circuit LT may be configured using a flip flop. The outputs of the respective match amplifiers (Ma0-MAm) are supplied to the match signal output lines MLo (MLo0-MLom) serving as output signal lines of the respective match amplifiers (Ma0-MAm).

The match line selection circuit unit (MLS) 26 includes the match line selection circuits MLS0-MLSm. Each of the match line selection circuits MLS0-MLSm includes an OR circuit OR, an N-channel MOS transistor (first MOS transistor) T1, and an N-channel MOS transistor (second MOS transistor) T2 as exemplified by the match line selection circuit MS0. Two inputs of the OR circuit OR are coupled to the two word lines (WLA[0], WLB[0]). The gate of the N-channel MOS transistor T1 is coupled to the output of the OR circuit OR. The gate of the N-channel MOS transistor T2 is coupled to the match signal output line MLo0. The source-drain route of the N-channel MOS transistor T1 and the source-drain route of the N-channel MOS transistor T2 are coupled in series between a reference potential such as the ground potential (GND) and the match reading line (MRL). The match reading line (MRL) is provided with a buffer amplifier BA whose operation is controlled by the sense amplifier enable signal SAE, and the output signal of the buffer amplifier BA is output as the match reading signal MR0.

It should be noted that the source of the N-channel MOS transistor T2 is coupled to a reference potential such as the ground potential (GND) in the above description, but may be coupled to a reference potential such as the power supply potential Vdd. Further, the N-channel MOS transistor (first MOS transistor) T1 and the N-channel MOS transistor (second MOS transistor) T2 may be changed to P-channel MOS transistors. Namely, the match line selection circuits (MLS0-MLSm) may be configured in such a manner that the match line selection circuits (MLS0-MLSm) can transmit the potential levels of the match signal output lines MLo (MLo0-MLom) to the match reading line (MRL).

The scan input circuit (SCC) 27 selects test search data input from a scan-in terminal SI in accordance with the signal level of the scan test mode signal STM and search data supplied from search data input terminals SD[0]-SD[n] in the normal operation mode. When the scan test mode signal STM indicates the test mode, selection circuits SE0-SEn included in the scan input circuit (SCC) 27 select the test search data input from the scan-in terminal SI, and supply the same from the outputs of flip flop circuits FF0-FEn to the inputs of search line drivers (SD0-SDn). On the other hand, when the scan test mode signal STM indicates the normal operation mode, the selection circuits SE0-SEn select the search data supplied from the search data input terminals SD[0]-SD[n] at the time of searching, and supply the same to the search line drivers (SD0-SDn) through the flip flop circuits FF0-FFn that are search data latches. The operations of the flip flop circuits FF0-FFn are controlled by the search latch enable signal SLE. When the scan test mode signal STM indicates the test mode, the test search data input from the scan-in terminal SI is sequentially shifted in accordance with the search latch enable signal SLE to be scanned in to the flip flop circuits FFF0-FFn. "SO" denotes a scan output terminal.

In FIG. 5, at the time of searching in the normal mode, the search data or a search key is input from the search data input terminals SD[0]-SD[n], and the search data is input to the pairs of search lines (ST[0], SB[0]-ST[n] SB[n]) by asserting the search latch enable signal SLE. Thereafter, a result of a match or mismatch between each entry and the search data is taken in to each of the latch circuits LT of the match amplifiers (MA0-MAm) through the match lines (ML[0]-ML[M]). The search result taken in to each of the latch circuits LT of the match amplifiers (MA0-MAm) is input to the priority encoder (PREN) 30 through the match signal output lines MLo (MLo0-MLom).

In the case where there is a mismatch as a result of a comparison between the search data and all entry data stored in the bit cells, the match lines (ML[0]-ML[M]) corresponding to the mismatch are extracted from the precharge potential to "0" (low level) such as the ground potential. The potential of the match lines (ML[0]-ML[M]) is taken in to each of the latch circuits LT of the match amplifiers (MA0-MAm), and is output to the match signal output lines MLo (MLo0-MLom).

The test of the disclosure is conducted in such a manner that a state of a mismatch of only one bit is intentionally generated in the bit cells coupled to the same match line ML, and the generation is executed for all the entries (hereinafter, this test method will be referred to as 1 bit-miss test).

In the disclosure, an entry of a search key is input from the scan-in terminal ST using the scan test mode signal STM, and then the searching can be performed using the search key. The 1 bit-miss test is conducted in the following manner.

1. "0" is stored in each bit cell (data of all the entries is set to "00 , , , 0").
2. Thereafter, All "0" is input to search data latches (FF1-FFn) to be initialized.
3. "1" is input from the scan-in terminal SI to activate the search latch enable signal SLE only once, and the searching is executed by setting the test search data as "10 , , , 0".

Accordingly, "1" is sequentially shifted to the search data latches (FF1-FFn) every time the searching is performed by activating the search latch enable signal SLE, and the 1 bit-miss test can be conducted.

In the selection of the outputs of the match signal output lines MLo0-MLom in the test, one of the match signal output lines MLoO-MLom is selected by the word line (WLA[0]-WLA[M], WLB[0]-WLB[M]) to be output as the match reading signal MR0. For example, in the case where the match signal output line MLo0 is selected by the match line selection circuit MLS0, the word line (WLA[0] or WLB[0]) is set to a selection state. Accordingly, the OR circuit OR in the match line selection circuit MLS0 turns on the N-channel MOS transistor T1. In the case where the potential of the match signal output line MLo0 is high (match), the N-channel MOS transistor T2 is turned on, and the high-level precharge potential of, for example, the match reading line (MRL) is discharged to the low level. In the case where the potential of the match signal output line MLo0 is low (mismatch), the N-channel MOS transistor T2 is turned off, and the high-level precharge potential of, for example, the match reading line (MRL) is maintained.

The timing of the output of the match reading signal MR0 is controlled by a timing signal SAE input to the buffer amplifier BA. The timing signal SAE is used together with an enable signal for the reading operation of the TCAM macro cell, namely, the sense amplifier enable signal supplied to the sense amplifier SA.

As shown in FIG. 2, the TCAM cell (bit cell) is in one of the three states 0, 1, and X, and thus two word lines (WLA and WLB) are generally coupled thereto. The logic OR (OR circuit) of the word lines WLA and WLB are used so that the match reading signal MR0 can be output by both of the word lines. The match reading signal MR0 may react with one of the word lines WLA and WLB. In this case, the OR circuit is deleted from the match line selection circuit MLS, and one of the word lines WLA and WLB is input to the gate of the N-channel MOS transistor T1. It should be noted that in the case where the TCAM cell of FIG. 4 is changed to the BCAM memory cell, the BCAM memory cell can be configured in such a manner that, for example, the word line WLB and the Y cell are deleted in FIG. 2, and the gate electrode of the MOS transistor Q8 is coupled to the storage node ND1_n of the X cell. In this case, too, the OR circuit is deleted from the match line selection circuit MLS, and the word line WLA is input to the gate of the N-channel MOS transistor T1.

Figure 6:
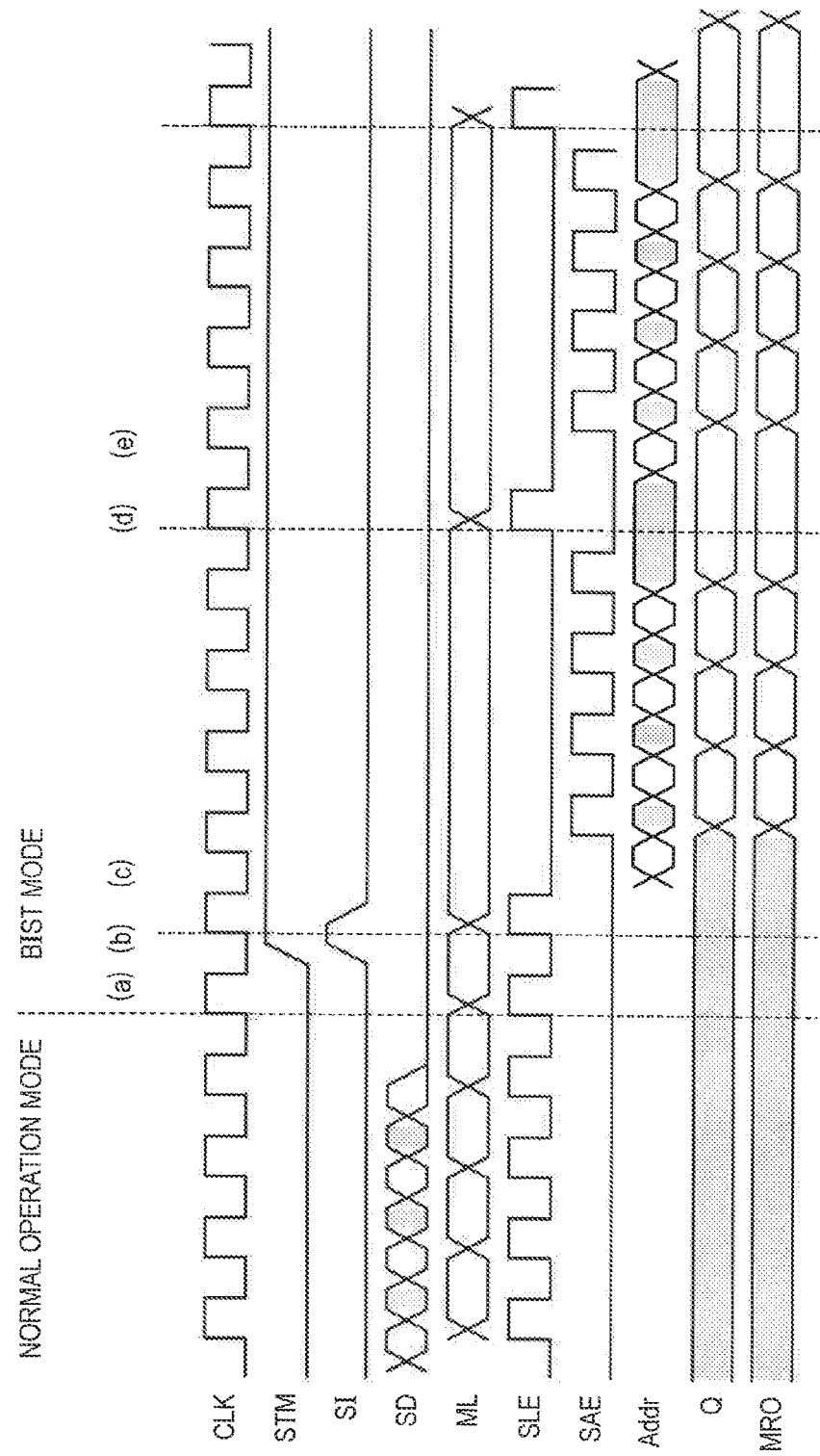
FIG. 6 is a diagram for showing a timing chart of a 1 bit-miss test.

FIG. 6 is a diagram for showing a timing chart of the 1 bit-miss test. FIG. 6 shows a state in which the normal operation mode is transmitted to the test mode (BIST mode).

FIG. 6 is a timing chart of the 1 bit-miss test in the case where the data of all the entries is All "0".

In the normal operation mode, the scan test mode signal STM is "0" (STM="0"), and the search data (SD) is supplied by triggering using a main clock signal CLK at the time of searching. Then, the search operation is performed by setting the search latch enable signal SLE to the high level, and match or mismatch data appears in the match line ML as a comparison result. The search operation is performed by sequentially inputting the search data (SD) and setting the search latch enable signal SLE to the high level. Although not shown in the drawing, the reading operation is performed by sequentially setting the sense amplifier enable signal SAE to the high level at the time of reading.

The 1 bit-miss test is executed in accordance with the following steps or procedures.

It is assumed that "0" is stored in each bit cell in advance (the data of all the entries is "00 , , , 0").

(a) First, the search operation is performed by setting the scan test mode signal STM to the low level (STM="L"), by setting all the bits of the search data to "0" (All "0"), and by setting the search latch enable signal SLE to the high level. The test search data is initialized.

(b) Next, the search operation is performed by setting the scan test mode signal STM to the high level (STM="H"), setting the scan input terminal SI to the high level (SI="H"), and setting the search latch enable signal SLE to the high level. The test search data is "10 , , , 0".

(c) It is confirmed that the match reading signal MR0 is in accordance with the expected value by reading all the addresses. Namely, the match reading signal MR0 is read by inputting the target address Addr (the address of the word line to be inspected or the address of the entry), changing the sense amplifier enable signal SAE to the high level "H", and selecting the match signal output line MLo (MLo0-MLom) corresponding to the address to be inspected. This operation is repeatedly performed for all the addresses, namely, all the entries. Accordingly, the signal level of the match signal output line MLo (MLo0-MLom) corresponding to each entry is read as the match reading signal MR0, and thus a comparison with the expected value in the case of the test search data "10 , , , 0" can be performed.

(d) Next, the search is executed by setting the scan input terminal SI to the low level (SI="L") and setting the search latch enable signal SLE to the high level in a state where the scan test mode signal STM is at the high level (STM="H") The test search data is "01 , , , 0".

(e) As similar to the above (c), it is confirmed that the match reading signal MR0 is in accordance with the expected value by reading all the addresses. Namely, the match reading signal MR0 is read by inputting the target address Addr (the address of the word line to be inspected or the address of the entry), changing the sense amplifier enable signal SAE to the high level ("H"), and selecting the match signal output line MLo (MLo0-MLom) corresponding to the address to be inspected. This operation is repeatedly performed for all the addresses, namely, all the entries. Accordingly, the signal level of the match signal output line MLo (MLo0-MLom) corresponding to each entry is read as the match reading signal MR0, and thus a comparison with the expected value in the case of the test search data "01 , , , 0" can be performed.

(f) The above (d) and (e) are repeated for the width of the search data. In the example of FIG. 5, the width of the search data is 1+n bits, and the above (d) and (e) including the above (b) are repeated 1+n times.

It should be noted that the reading data is output from a reading data terminal Q (Q[0]-Q[n]) in the above (c) and (d). However, the reading data may be used or need not be used for the verification of the test.

Namely, "0" is stored in the search data latch in the above (a), and the search operation is performed by setting the first bit of the search data to "1" in the above (b). Accordingly, the search data and the entry data of the TCAM cell match each other except for the first bit. Thereafter, the data of the latch circuit LT of the match amplifier (MA0-MAm) is read as the match reading signal MR0 through the match reading line (MPL) using the reading mode (SAE="H") in the above (c), and is determined with the expected value.

In the above (d), since the scan test mode signal STM is STM="H", the search data is input from the scan path (scan input terminal SI). Since the scan input terminal SI is SI="L", SD[0]="H" of the original search data SD[0] is shifted, resulting in SD[0]="L" and SD[1]="H". Then, when the search result is stored in the latch circuit LT of the match amplifier (MA0-MAm) after executing the search, the match reading signal MR0 is read in the above (e), and is determined with the expected value. It is possible to conduct the 1 bit-miss test for all the entries and all the bits of all the entries by repeating the above (d) and (e).

According to the example, the number of wirings for the test signal to output the test result is reduced, and the wiring property can be improved. Further, the number of wirings for the test signal to input the test data (test search data) is reduced, and the wiring property can be improved. Furthermore, the scale of the logic circuit for DFT (Design For Test) can be reduced.

First Modified Example

Figure 7:
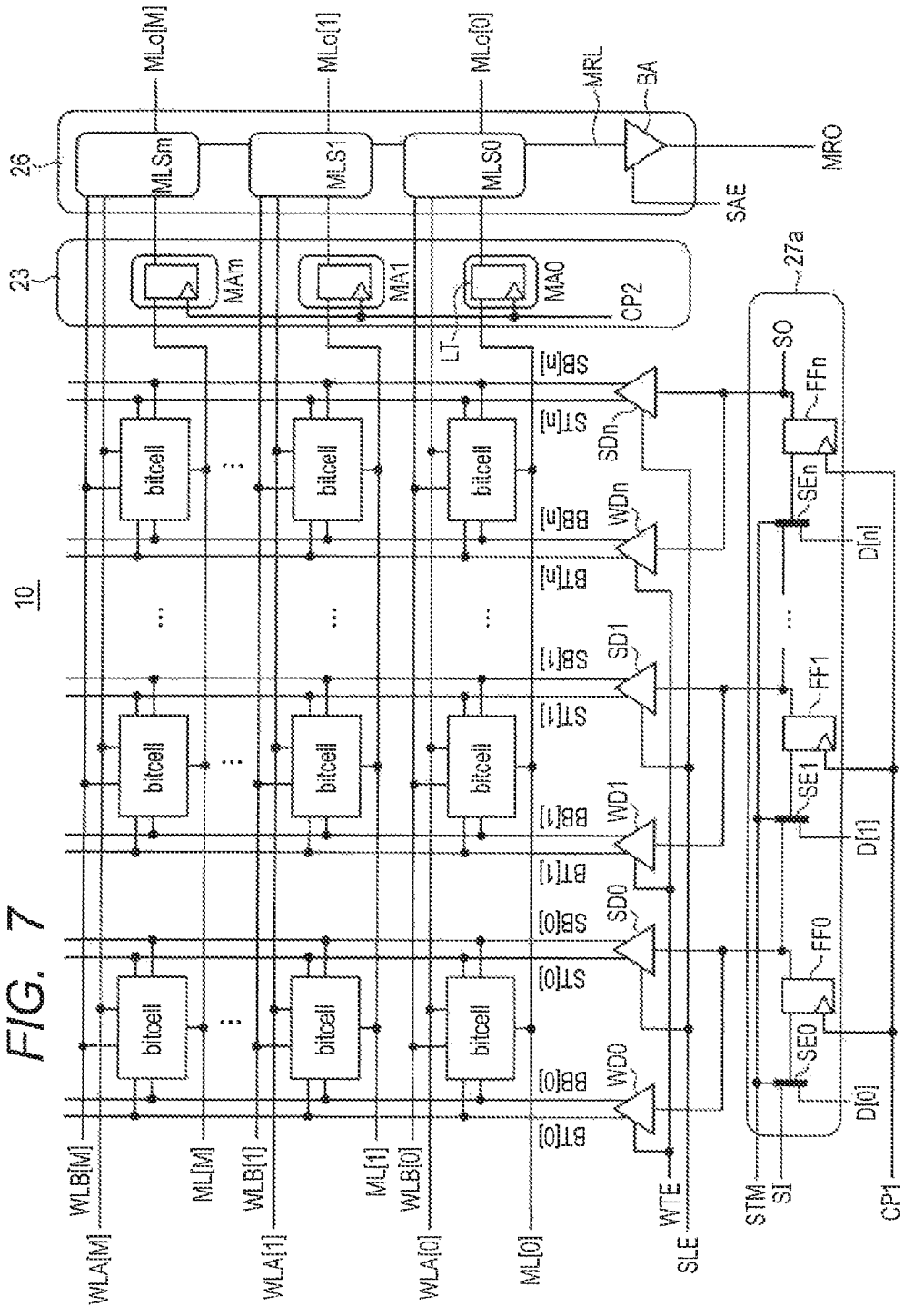
FIG. 7 is a circuit diagram for conceptually showing a TCAM macro cell according to a first modified example.

FIG. 7 is a circuit diagram for conceptually showing a TCAM macro cell according to a first modified example. FIG. 7 is a drawing for showing a modified example of the scam input circuit (SCC) 27 of FIG. 5 The first modified example can be applied to the example.

In FIG. 7, a scan input circuit (SCC) 27a is configured to input the search data and writing data from data input terminals D[0]-D [n] by using both a search data input terminal normal input and a writing data input terminal. Accordingly, a flip flop of the writing data and a flip flop of the search data are combined to one, and further a scan path is provided to enable the 1 bit-miss test. Further, the scan data can be written into the TCAM cell, and thus it is possible to handle various patterns of test data.

FIG. 7 is different from FIG. 5 in that the outputs of flip flops FF0-FFn in the scan input circuit (SCC) 27a in FIG. 7 are coupled to the inputs of a plurality of search line drivers (SD0-SDn) and the inputs of a plurality of writing drivers WD0-WDn, and the search data input terminals SD[0]-SD [n] are changed to the data input terminals D[0]-D [n]. The operations of the flip flops FF0-FFn are controlled by a latch trigger CP1. The operations of the writing drivers WD0-WDn are controlled by a writing enable signal WTE. It should be noted that the writing drivers WD0-WDn and the search line drivers SD0-SDn are exclusively operated. The other configurations of FIG. 7 are the same as those of FIG. 5, and thus the explanation thereof will be omitted.

According to the first modified example, the circuit scale or circuit area can be reduced by sharing the input latch of the writing data and the input latch of the search data.

Second Modified Example

Figure 8A:
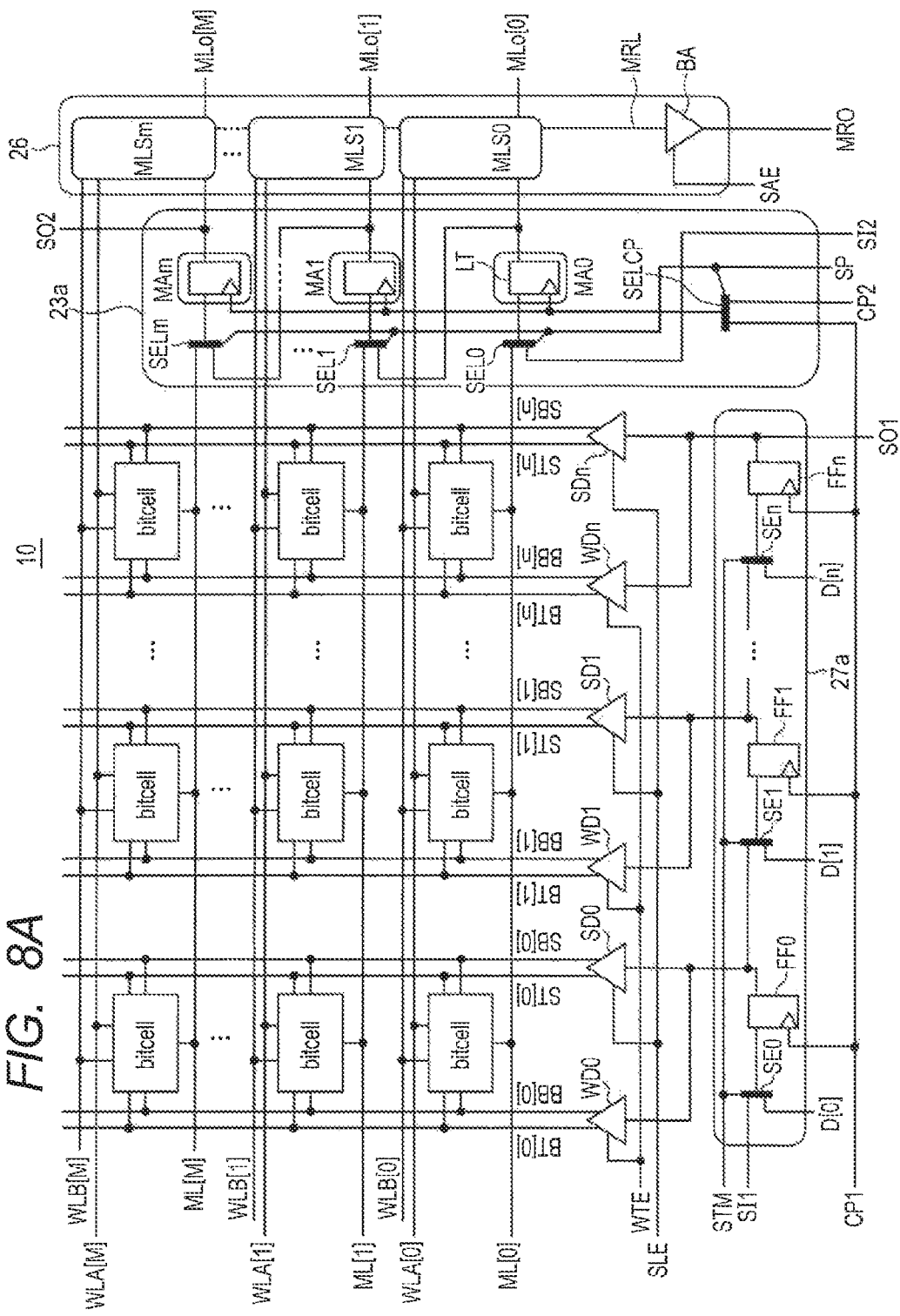
FIG. 8A is a circuit diagram for conceptually showing a TCAM macro cell according to a second modified example.
Figure 8B:
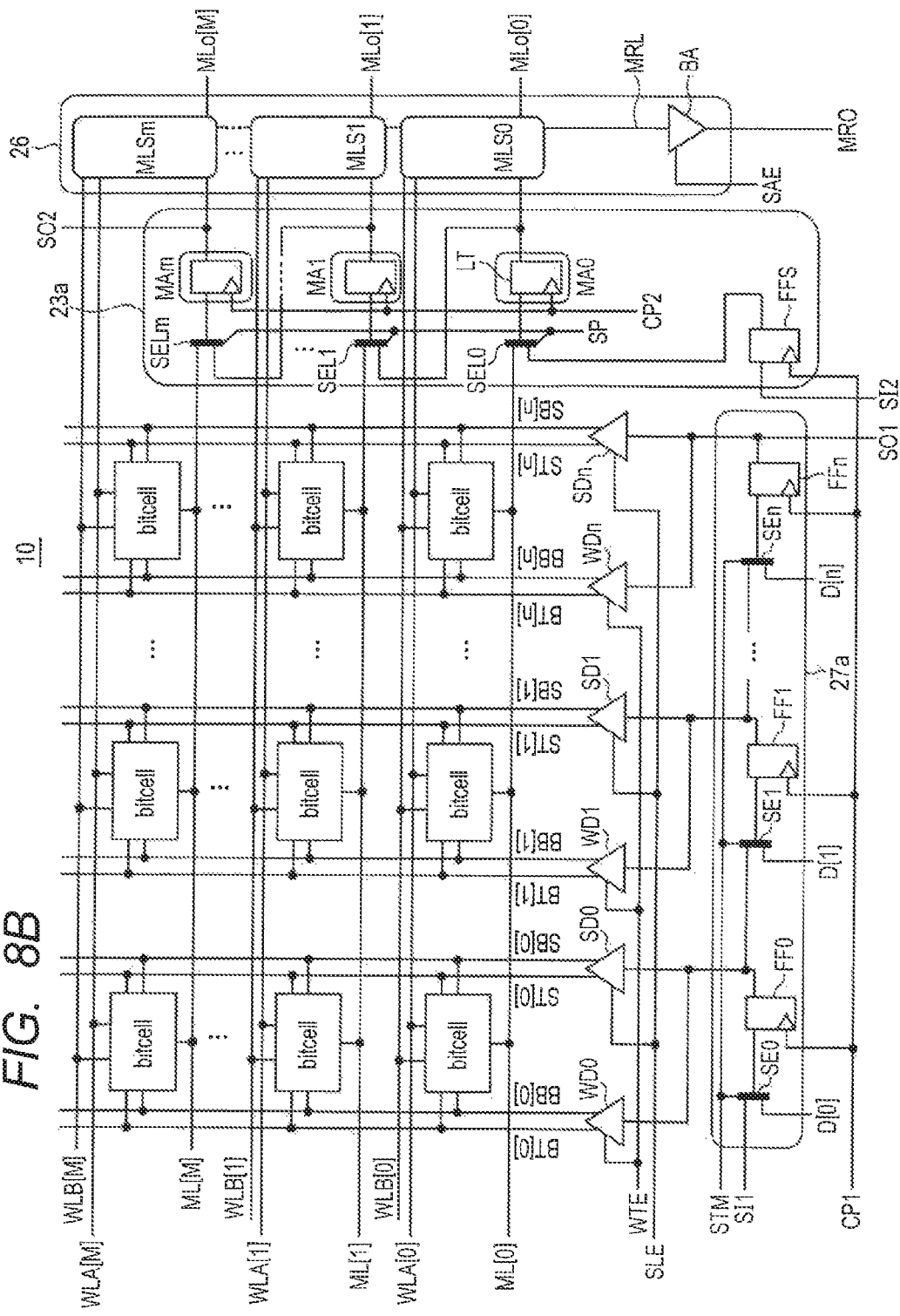
FIG. 8B is a circuit diagram for conceptually showing the TCAM macro cell according to the second modified example.

FIG. 8A and FIG. 8B are circuit diagrams each conceptually showing a TCAM macro cell according to a second modified example. The configurations of FIG. 8A and FIG. 8B are realized by providing scan paths to a plurality of latch circuits LT in a match amplifying unit 23a in the configuration of FIG. 7. The second modified example of FIG. 8A and FIG. 8B can be applied to the example and the first modified example.

In FIG. 8A, the scan paths of the latch circuits LT in the match amplifying unit 23a are provided between a second scan-in data terminal SI2 and a second scan-out data terminal SO2. The second scan-in data terminal SI2 is coupled to the second input of a selection circuit SEL0. The output of the selection circuit SEL0 is joined to the input of the latch circuit LT of the match amplifier MA0, and the output of the latch circuit LT of the match amplifier MA0 is coupled to the second input of a selection circuit SEL1. The output of the latch circuit LT of a match amplifier MA1 is joined to the second input of a selection circuit SEL2 (not shown) in the next stage. The circuits are sequentially coupled to each other as described above, and the output of the latch circuit LT of a match amplifier MAm is coupled to the second scan-out data terminal SO2. The first inputs of the selection circuits SEL0-SELm are coupled to match lines ML[0]-ML[M], respectively. A scan path mode signal SP is supplied to the control inputs of the selection circuits SEL0-SELm. The high level of the scan path mode signal SP indicates the scan path mode, and the low level thereof indicates the normal operation mode. When the scan path mode signal SP is set to the high level, the second inputs of the selection circuits SEL0-SELm are coupled to the outputs thereof. On the other hand, when the scan path mode signal SP is set to the low level, the first inputs of the selection circuits SEL0-SELm are coupled to the outputs thereof.

The latch trigger of the latch circuits LT in the match amplifying unit 23a is supplied by a selection circuit SELCP. A latch trigger CP1 of flip flops FF0-FFn in a scan input circuit (SCC) 27a is supplied to the first input of the selection circuit SELCP. A latch trigger CP2 is supplied to the second input of the selection circuit SELCP, and the scan path mode signal SP is supplied to the control input of the selection circuit SELCP. Thus, when the scan path mode signal SP indicates the scan path mode of the high level, the selection circuit SELCP selects the latch trigger CP1 as a latch trigger, and supplies the same to the latch circuits LT in the match amplifying unit 23a. Accordingly, the scan paths of the latch circuits LT in the match amplifying unit 23a are formed between the second scan-in data terminal SI2 and the second scan-out data terminal SO2, and the data stored in the latch circuits LT in the match amplifying unit 23a is scan-shifted to be output from the second scan-out data terminal SO2. On the other hand, when the scan path mode signal SP indicates the normal mode of the low level, the selection circuit SELCP selects the latch trigger CP2 as a latch trigger, and supplies the same to the latch circuits LT in the match amplifying unit 23a. In this case, the result of the search test is taken in to the latch circuits LT in the match amplifying unit 23a by the latch trigger CP2. It should be noted that the test result taken in to the latch circuits LT in the match amplifying unit 23a can be output from the second scan-out data terminal SO2 by setting the scan path mode signal SP to the high level as similar to the above.

In FIG. 8B, the selection circuit SELCP of FIG. 8A is deleted, and a flip flop FFS is provided instead. In FIG. 8B, as similar to FIG. 8A, the scan paths of the latch circuits LT in the match amplifying unit 23a are provided between the second scan-in data terminal SI2 and the second scan-out data terminal SO2. The second scan-in data terminal SI2 is coupled to the input of a first-stage flip flop FFS, and the output of the first-stage flip flop FFS is coupled to the second input of the selection circuit SEL0. The output of the selection circuit SEL0 is joined to the input of the latch circuit LT of the match amplifier MA0, and the output of the latch circuit LT of the match amplifier MA0 is coupled to the second input of the selection circuit SEL1. The output of the latch circuit LT of the match amplifier MA1 is joined to the second input of the selection circuit SEL2 (not shown) in the next stage. The circuits are sequentially coupled to each other as described above, and the output of the latch circuit LT of the match amplifier MAm is coupled to the second scan-out data terminal SO2. The first inputs of the selection circuits SEL0-SELm are coupled to the match lines ML[0]-ML[M], respectively. The scan path mode signal SP is supplied to the control inputs of the selection circuits SEL0-SELm. The high level of the scan path mode signal SP indicates the scan path mode, and the low level thereof indicates the normal operation mode. When the scan path mode signal SP is set to the high level, the second inputs of the selection circuits SEL0-SELm are coupled to the outputs thereof. On the other hand, when the scan path mode signal SP is set to the low level, the first inputs of the selection circuits SEL0-SELm are coupled to the outputs thereof.

By providing the scan paths of the latch circuits LT in the match amplifying unit 23a, the scan-in data terminal of the scan input circuit (SCC) 27a is used as a first scan-in data terminal SI1, and a first scan-out data terminal SO1 is provided in the scar input circuit (SCC) 27a.

For the test of the logic circuit (for example, the priority encoder PREN) in the following stage that receives the outputs of the match signal output lines MLo (MLo0-MLom), scan flip flops (SFF) are provided to even the match signal output lines MLo (MLo0-MLom). In general, the scan flip flops (SFF) are arranged outside the TCAM macro cell. In this case, it is necessary to arrange the scan flip flops (SFF) the number of which corresponds to the address spaces (the number of entries), possibly causing an area demerit and a deterioration in the wiring property.

In FIG. 8B, the scan paths are provided to the latch circuits LT of the match amplifying, unit 23a of the TCAM macro cell. The characteristic in the configuration is that the latch trigger CP1 of the first-stage flip flop FFS coupled to the second scan-in data terminal SI2 and the latch trigger CP2 of the latch circuit LT of the match amplifying unit 23a are different latch trigger signals.

In general, since the load of the match lines ML (ML0-MLm) is large, a period of time (delay time) required from starting the search to outputting the search result becomes long. Thus, in order to correctly latch the outputs of the match lines ML (ML0-MLm) by the latch circuits LT in the match amplifying unit 23a, the latch trigger CP2 needs to be asserted or activated later than the latch trigger CP1. On the contrary, if the latch trigger CP2 is used as the latch trigger of the first-stage flip flop FFS coupled to the second scan-in data terminal SI2, the data supplied to the second scan-in data terminal SI2 needs to be held until the latch trigger CP2 is asserted. Thus, there is a risk that the timing design becomes extremely difficult. Accordingly, not the latch trigger CP2 but the latch trigger CP1 is used as the latch trigger of the first-stage flip flop FFS coupled to the second scan-in data terminal SI2.

According to the second modified example of FIG. 8E, the latch trigger of the first-stage flip flop FFS coupled to the second scan-in data terminal SI2 is shared with the latch trigger OP1 of input data latches (FF0-FFn) and thus the wiring property of the latch trigger can be improved.

Figure 9:
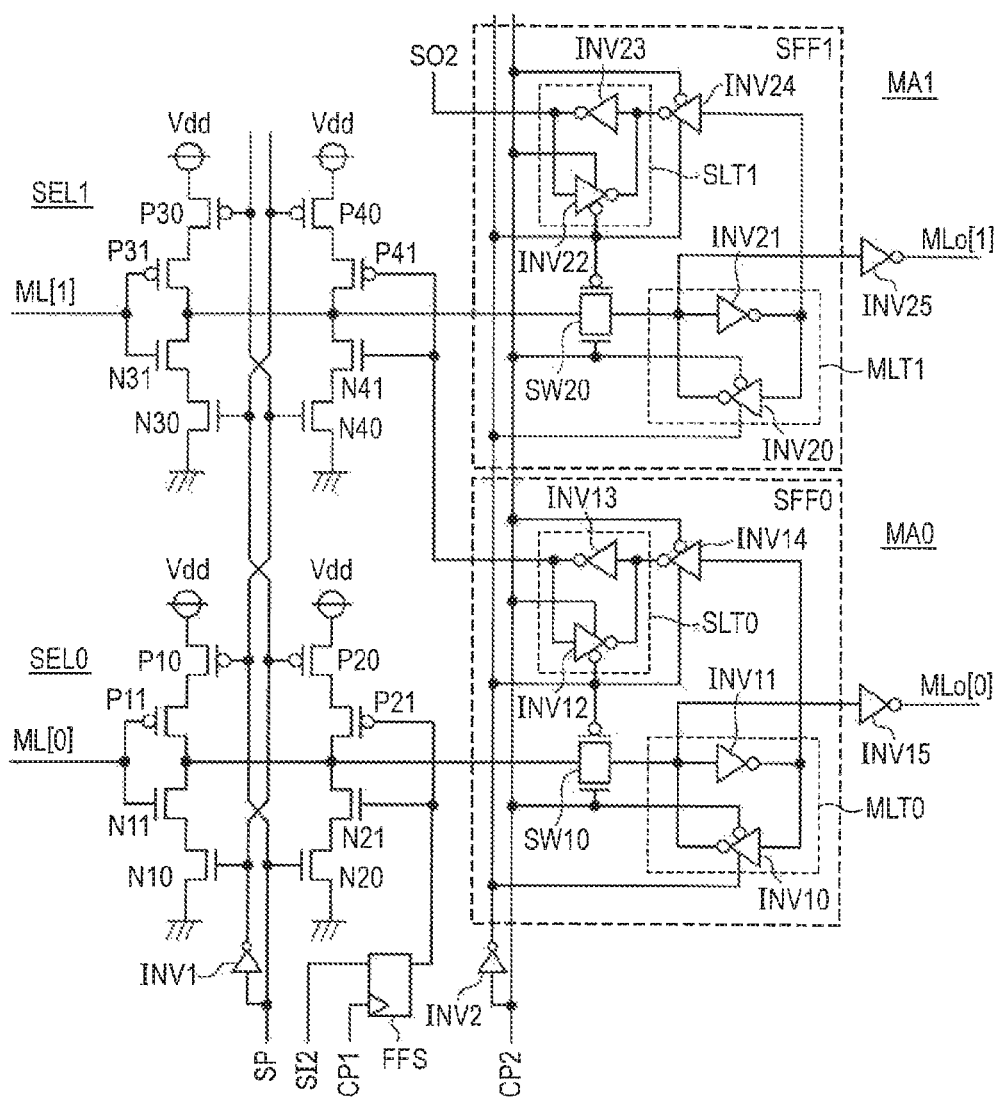
FIG. 9 is a diagram for showing an example of circuit configurations of selection circuits and latch circuits of match amplifiers according to the second modified example.

FIG. 9 is a diagram for showing an example of circuit configurations of the selection circuits and the latch circuits of the match amplifiers according to the second modified example. FIG. 9 shows an example of circuit configurations of the selection circuits SEL0 and SEL1 and the latch circuits LT of the match amplifiers MA0 and MA1 shown in FIG. 8A or FIG. 8B. In this example, the latch circuits LT of the match amplifiers MA0 and MA1 are changed to scan flip flops SFF0 and SFF1.

The selection circuit SEL0 has a first clocked inverter circuit including P-channel MOS transistors P10 and P11 and N-channel MOS transistors N10 and N11, and a second clocked inverter circuit including P-channel MOS transistors P20 and P21 and N-channel MOS transistors N20 and N21.

In the first clocked inverter circuit, the gates of the P-channel MOS transistor P11 and the N-channel MOS transistor N11 serve as the first input of the selection circuit SEL0, and are coupled to the match line ML[0]. The common drain of the P-channel MOS transistor P11 and the N-channel MOS transistor N11 serves as the output of the selection circuit SEL0, and is coupled to the input of the match amplifier MA0. The source of the P-channel MOS transistor P11 is coupled to the power supply potential Vdd through the source-drain route of the P-channel MOS transistor P10. The source of the N-channel MOS transistor N11 is coupled to the ground potential through the source-drain route of the N-channel MOS transistor N10. The gate of the P-channel MOS transistor P10 is coupled so as to receive the scan path mode signal SP, and the gate of the N-channel MOS transistor N10 is coupled so as to receive the inverted signal of the scan path mode signal SP through the inverter INV1.

In the second clocked inverter circuit, the gates of the P-channel MOS transistor P21 and the N-channel MOS transistor N21 serve as the second input of the selection circuit SEL0, and are coupled to the output of the first-stage flip flop circuit FFS. The common drain of the P-channel MOS transistor P21 and the N-channel MOS transistor N21 serves as the output of the selection circuit SEL0, and is coupled to the input of the match amplifier MA0. The source of the P-channel MOS transistor P21 is coupled to the power supply potential Vdd through the source-drain route of the P-channel MOS transistor P20. The source of the N-channel MOS transistor N21 is coupled to the ground potential through the source-drain route of the N-channel MOS transistor N20. The gate of the P-channel MOS transistor P20 is coupled so as to receive the inverted signal of the scan path mode signal SP through the inverter INV1, and the gate of the N-channel MOS transistor N20 is coupled so as to receive the scan path mode signal SP.

The selection circuit SEL1 has a third clocked inverter circuit including P-channel MOS transistors P30 and P31 and N-channel MOS transistors N30 and N31, and a fourth clocked inverter circuit including P-channel MOS transistors P40 and P41 and N-channel MOS transistors N40 and N41.

In the third clocked inverter circuit, the gates of the P-channel MOS transistor P31 and the N-channel MOS transistor N31 serve as the first input of the selection circuit SEL1, and are coupled to the match line ML[1]. The common drain of the P-channel MOS transistor P31 and the N-channel MOS transistor N31 serves as the output of the selection circuit SEL1, and is coupled to the input of the match amplifier MA1. The source of the P-channel MOS transistor P31 is coupled to the power supply potential Vdd through the source-drain route of the P-channel MOS transistor P30. The source of the N-channel MOS transistor N31 is coupled to the ground potential through the source-drain route of the N-channel MOS transistor N30. The gate of the P-channel MOS transistor P30 is coupled so as to receive the scan path mode signal SP, and the gate of the N-channel MOS transistor N30 is coupled so as to receive the inverted signal of the scan path mode signal SP through the inverter INV1.

In the fourth clocked inverter circuit, the gates of the P-channel MOS transistor P41 and the N-channel MOS transistor N41 serve as the second input of the selection circuit SEL1, and are coupled to the output of the match amplifier MA0. The common drain of the P-channel MOS transistor P41 and the N-channel MOS transistor N41 serves as the output of the selection circuit SEL1, and is coupled to the input of the match amplifier MA1. The source of the P-channel MOS transistor P41 is coupled to the power supply potential Vdd through the source-drain route of the P-channel MOS transistor P40. The source of the N-channel MOS transistor N41 is coupled to the ground potential through the source-drain route of the N-channel MOS transistor N40. The gate of the P-channel MOS transistor P40 is coupled so as to receive the inverted signal of the scan path mode signal SF through the inverter INV1, and the gate of the N-channel MOS transistor N40 is coupled so as to receive the scan path mode signal SP.

The match amplifier MA0 includes a master latch circuit MLT0 and a slave latch circuit SLT0.

The master latch circuit MLT0 includes an inverter INV10 and an inverter circuit INV11 the inputs and outputs of which are joined to each other in a crossed manner. The input of the inverter INV11 is coupled to the second input of the selection circuit SEL0 through a CMOS switch SW10 configured using a P-channel MOS transistor and an N-channel MOS transistor. The input of the inverter INV11 is also coupled to the match signal output line MLo0 through an inverter INV15. The output of the inverter INV11 is coupled to the input of the slave latch circuit SLT0 through an inverter INV14.

The slave latch circuit SLT0 includes an inverter INV12 and an inverter circuit INV13 the inputs and outputs of which are joined to each other in a crossed manner. The input of the inverter INV13 is coupled to the output of the inverter INV14, and the output of the inverter INV13 is coupled to the second input of the selection circuit SEL1.

The inverter INV10, the inverter INV12, and the inverter INV14 are clocked inverter circuits, and receive inverted signals obtained by inverting the latch trigger CP2 and the latch trigger CP2 by the inverter INV2. The inverter INV10 and the inverter INV14 are operated with a negative phase as compared to the operation of the inverter INV12. In the case where the latch trigger CP2 is set to the high level, the inverter INV10 and the inverter INV14 are turned off, and the inverter INV12 is turned on. In the case where the latch trigger CP2 is set to the low level, the inverter INV10 and the inverter INV14 are turned on, and the inverter INV12 is turned off. When the latch trigger CP2 is set to the high level, the CMOS switch SW10 is turned on. When the latch trigger CP2 is set to the low level, the CMOS switch SW10 is turned off.

The match amplifier MA1 includes a master latch circuit MLT1 and a slave latch circuit SLT1.

The master latch circuit MLT1 includes an inverter INV20 and an inverter circuit INV21 the inputs and outputs of which are joined to each other in a crossed manner. The input of the inverter INV21 is coupled to the second input of the selection circuit SEL1 through a CMOS switch SW20 configured using a P-channel MOS transistor and an N-channel MOS transistor. The input of the inverter IV21 is also coupled to the match signal output line MLo1 through an inverter INV25. The output of the inverter INV21 is coupled to the input of the slave latch circuit SLT1 through an inverter INV24.

The slave latch circuit SLT1 includes an inverter INV22 and an inverter circuit INV23 the inputs and outputs of which are joined to each other in a crossed manner. The input of the inverter INV23 is coupled to the output of the inverter INV24, and the output of the inverter INV23 is coupled to the second input of the selection circuit in the next stage. FIG. 9 schematically illustrates a state in which the output of the inverter INV23 is coupled to the second scan-out data terminal SO2.

The inverter INV20, the inverter INV22, and the inverter INV24 are clocked inverter circuits, and receive inverted signals obtained by inverting the latch trigger CP2 and the latch trigger CP2 by the inverter INV2. The inverter INV20 and the inverter INV24 are operated with a negative phase as compared to the operation of the inverter INV22. In the case where the latch trigger CP2 is set to the high level, the inverter INV20 and the inverter INV24 are turned off, and the inverter INV22 is turned on. In the case where the latch trigger CP2 is set to the low level, the inverter INV20 and the inverter INV24 are turned on, and the inverter INV22 is turned off. When the latch trigger CP2 is set to the high level, the CMOS switch SW20 is turned on. When the latch trigger CP2 is set to the low level, the CMOS switch SW20 is turned off.

In the normal operation mode in which the scan path mode signal SP is set to the low level, the P-channel MOS transistors P10 and P30 and the N-channel MOS transistors N10 and N30 are turned on. Thus, the signal levels of the match lines ML[0] and ML[1] are supplied to the inputs of the match amplifiers MA0 and MA1, respectively. The P-channel MOS transistors P20 and P40 and the N-channel MOS transistors N20 and N40 are turned off. At this time, when the latch trigger CP2 is set to the high level, the CMOS switches SW10 and SW20 are turned on, and signals according to the signal levels of the match lines ML[0] and ML[1] are supplied to the match signal output lines MLo0 and MLo1 through the inverters INV15 and INV25, respectively. Thereafter, when the latch trigger CP2 is set to the low level, the CMOS switches SW10 and SW20 are turned off, the inverters INV10 and INV20 are turned on, and levels according to the signal levels of the match lines ML[0] and ML[1] are held in the master latches MLT0 and MLT1, respectively.

In the scan path mode in which the scan path mode signal SP is set to the high level, the P-channel MOS transistors P20 and P40 and the N-channel MOS transistors N20 and N40 are turned on. The P-channel MOS transistors P10 and P30 and the N-channel MOS transistors N10 and N30 are turned off. Accordingly, the output of the first-stage FFS holding the signal supplied to the second scan-in data terminal SI2 is supplied to the input of the match amplifier MA0. Further, the output of the slave latch of the match amplifier MA0 is supplied to the input of the match amplifier MA1.

When the latch trigger CP2 is set to the high level in this state, the CMOS switches SW10 and SW20 are turned on, and the output of the first-stage FFS and the output of the slave latch SLT0 of the match amplifier MA0 are supplied to the master latch MLT0 of the match amplifier MA0 and the master latch MLT1 of the match amplifier MA1, respectively. At this time, the inverters INV14 and INV24 are turned off.

Thereafter, when the latch trigger CP2 is set to the low level, the CMOS switches SW10 and SW20 are turned off, and the master latch MLT0 of the match amplifier MA0 and the master latch MLT1 of the match amplifier MA1 hold the output of the first-stage FFS and the output of the slave latch SLT0 of the match amplifier MA0, respectively. At this time, since the inverters INV14 and INV24 are turned on, the storage states of the master latch MLT0 of the match amplifier MA0 and the master latch MLT1 of the match amplifier MA1 are supplied to the slave latch SLT0 of the match amplifier MA0 and the slave latch SLT1 of the match amplifier MA1, respectively.

As described above, in the scan path mode in which the scan path mode signal SP is set to the high level, the output of the first-stage FFS is sequentially transmitted to the match amplifier MA0 and the match amplifier MA1.

According to this configuration, the high speeds of the outputs of the match lines ML[0] and ML[1] can be realized by using the first stage as the selectors (the second clocked inverter circuit and the fourth clocked inverter circuit) from the scan path and by outputting signals from the master latches MLT0 and MLT1 of the scan flip flops SFF0 and SFF1 to the match signal output lines MLo[0] and MLo[1], respectively. Further, the load of the master latches MLT0 and MLT1 can be reduced by outputting signals from the slave latches SLT0 and SLT1 on the scan path side.

Third Modified Example

Figure 10A:
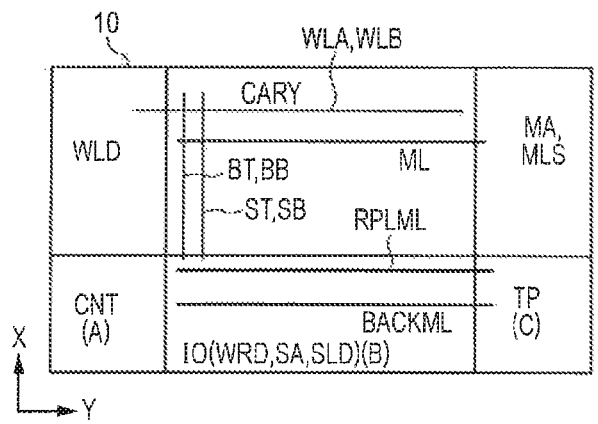
FIGS. 10A-10C are diagrams for describing a generation method of an output latch trigger according to a third modified example.
Figure 10C:
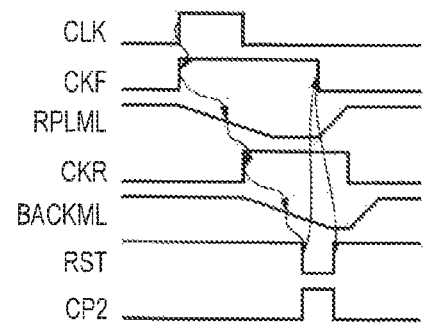
Figure 10B:
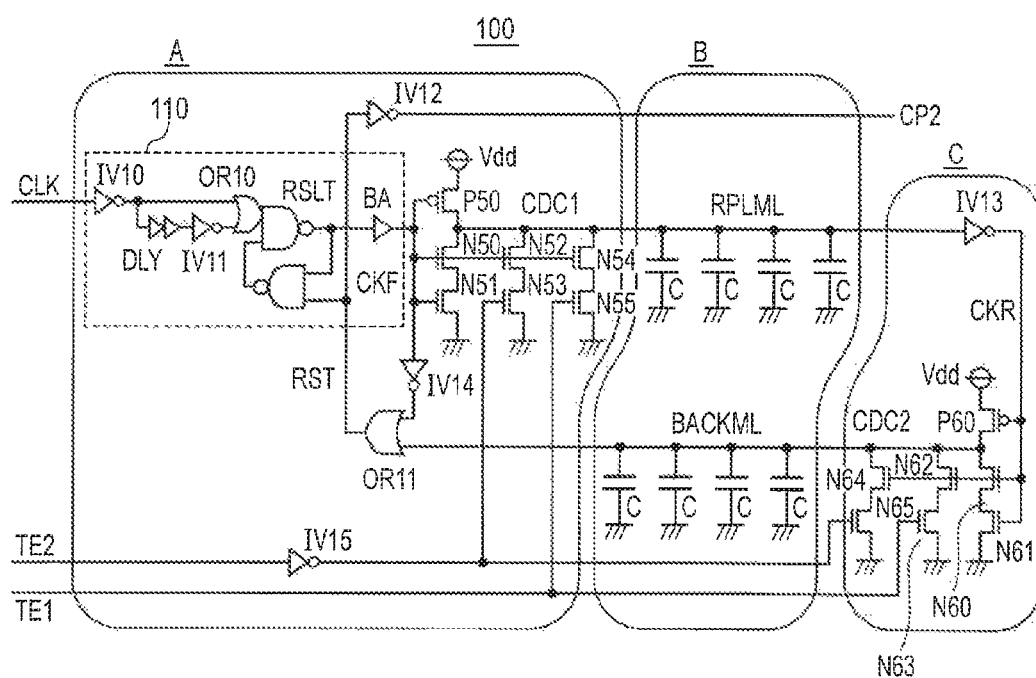

FIGS. 10A-10C are diagrams for describing a generation method of an output latch trigger according to a third modified example. FIGS. 10A-10C are diagrams for describing a generation method of an output latch trigger CP2 of the latch circuit LT (or the scan flip flop SFF) in the match amplifying unit. The third modified example can be applied to the example, the first modified example, and the second modified example.

As described above, since the load of the match line ML is large, it is necessary to delay the output latch trigger CP2 of the latch circuit LT. In the case of the compiled TCAM macro cell, the data width (the number of bits of one entry) can be variably changed. Therefore, the length of the match line LM is changed in accordance with the data width (the number of bits of one entry). It is obvious that when the length of the match line ML is short, the load of the match line ML is light. The potential of the match line ML can be changed at a high speed. Therefore, when the length of the match line ML is short, the output latch trigger CP2 is desirably made faster.

In the third modified example, the data width is replicated by using a first load wiring RPLML and a first load wiring BACKML that are arranged in the direction parallel to the matchline ML. Accordingly, the optimum output latch trigger CP2 can be generated.

FIG. 10A is a diagram for showing a layout arrangement relationship among the match line ML, the first load wiring RPLML, and the first load wiring BACKML. FIG. 10B is a diagram for showing an example of a circuit configuration of a latch trigger generation circuit 100 for generating the latch trigger CP2. FIG. 10C is a diagram for conceptually showing the timing of the latch trigger generation circuit 100.

FIG. 10A conceptually shows the layout arrangement of the TCAM macro cell 10 of FIG. 4. The word line driver (WLD) 25, the TCAM cell array (CARY) 20, the match amplifying unit (MA) 23, and the match line selection circuit unit (MLS) 26 are sequentially arranged along the Y direction. In the X direction, a formation area for the control logic circuit (CNT) 24 is arranged under the word line driver (WLD) 25. In the Y direction, an input/output circuit area IO including the writing driver and reading sense amplifier (WD/SA) 21 and the search line driver (SD) 22 is arranged on the right side of the control logic circuit (CNT) 24. In the Y direction, an area TP is arranged on the right side of the input/output circuit area IO.

In the TCAM cell array CARY, one match line ML is exemplified, and is arranged along the Y direction. In the TCAM cell array CARY, the word lines (WLA and WLB) arranged along the Y direction, the pair of bit lines (BT and BB) arranged along the X direction, and the pair of search lines (ST and SB) arranged along the X direction are further exemplified.

In the input/output circuit area IO, the first load wiring RPLML and the first load wiring BACKML are illustrated. The first load wiring RPLML and the first load wiring BACKML are arranged in parallel with the match line ML along the Y direction. The lengths of the match line ML, the first load wiring RPLML, and the first load wiring RPLML, are the same. The lengths of the match line ML, the first load wiring RPLML, and a second load wiring BACKML are configured to be determined in accordance with the data width (the number of bits of one entry). Namely, the first load wiring RPLML and the second load wiring BACKML can be regarded as wirings (replica wirings) obtained by replicating the match line ML. A parasitic capacitance having the value substantially the same as that of the parasitic capacitance of the match line ML is provided in each of the first load wiring RPLML and the second load wiring BACKML.

FIG. 10B shows an example of the latch trigger generation circuit for generating the latch trigger CP2. The latch trigger generation circuit 100 includes a first circuit part A formed in the arrangement area of the control logic circuit (CNT) 24 of FIG. 10A, a second circuit part B formed in the arrangement area of the input/output circuit area IO of FIG. 10A, and a third circuit part C formed in the arrangement area denoted by the area TP of FIG. 10A.

The latch trigger generation circuit 100 includes a first clock generation circuit 110 that generates a first internal clock signal CKF from the main clock signal CLK. The first clock generation circuit 110 includes an inverter IV10, an OR circuit OR10, a delay circuit DLY, an inverter IV11, a set/reset latch circuit RSLT, and a buffer amplifier BA.

The first internal clock signal CKF generated by the first clock generation circuit 110 is input to a first charging/discharging circuit CDC1 that charges or discharges the first load wiring RPLML. The first charging/discharging circuit CDC1 includes a P-channel MOS transistor P50 and N-channel MOS transistors N50-N55. The P-channel MOS transistor P50 charges the load capacitance C of the first load wiring RPLML in accordance with the high level of the first internal clock signal CKF. Further, the N-charnel MOS transistors N50 and N51 discharge the load capacitance C of the first load wiring RPLML in accordance with the low level of the first internal clock signal CKF. The gate of the N-channel MOS transistor N53 is coupled to a second test terminal TE2 through an inverter IN15. When the N-charnel MOS transistor N53 is turned on, the load capacitance C of the first load wiring RPLML is discharged by the N-channel NOS transistors N52 and N53. Likewise, the gate of the N-charnel MOS transistor N55 is coupled to a first test terminal TF1. When the N-channel MOS transistor N55 is turned on, the load capacitance C of the first load wiring RPLML is discharged by the N-channel MOS transistors N54 and N55. To the first test terminal TE1 and the second test terminal TE2, supplied is a signal level such as the high level "H" in the test, and supplied is a signal level such as the low level "L" in the normal operation. Thus, the N-channel MOS transistor N53 is turned off in the test, and is turned on in the normal operation. Therefore, the speed of discharging the load capacitance C of the first load wiring RPLML becomes slower in the test as compared to that in the normal operation. On the other hand, the N-channel MOS transistor N55 is turned on in the test, and is turned off in the normal operation. Therefore, the speed of discharging the load capacitance C of the first load wiring RPLML becomes faster in the test as compared to that in the normal operation.

An inverter IV13 generates a second internal clock signal CKR in accordance with the level of the first load wiring RPLML. The second internal clock signal CKR is input to a second charging/discharging circuit CDC2 that charges or discharges the second load wiring BACKML in accordance with the second internal clock signal CKR.

The second charging/discharging circuit CD2 includes a P-channel MOS transistor P60 and N-channel MOS transistors N60-N65. The P-channel MOS transistor P60 charges the load capacitance C of the second load wiring BACKML in accordance with the high level of the second internal clock signal CKR. Further, the N-channel MOS transistors N60 and N61 discharge the load capacitance C of the second load wiring BACKML in accordance with the low level of the second internal clock signal CKR.

The gate of the N-channel MOS transistor N63 is coupled to the first test terminal TE1. When the N-channel MOS transistor N63 is turned on, the load capacitance C of the second load wiring BACKML is discharged by the N-channel MOS transistors N62 and N63. Likewise, the gate of the N-channel MOS transistor N65 is coupled to the second test terminal TE2 through the inverter IN15. When the N-channel MOS transistor N65 is turned on, the load capacitance C of the second load wiring BACKML is discharged by the N-channel MOS transistors N64 and N65. It should be noted that the N-channel MOS transistor N65 is turned off in the test, and is turned on in the normal operation. Therefore, the speed of discharging the load capacitance C of the second load wiring BACKML becomes slower in the test as compared to that in the normal operation. On the other hand, the N-channel MOS transistor N63 is turned on in the test, and is turned off in the normal operation. Therefore, the speed of discharging the load capacitance C of the second load wiring BACKML becomes faster in the test as compared to that in the normal operation.

An OR circuit OR14 has a first input joined to the second load wiring BACKML and a second input that receives the first internal clock signal CKF through an inverter IV14. The output of the OR circuit OR14 is input to the reset terminal of the set/reset latch circuit RSLT as a reset signal RST. Further, the output of the OR circuit OR14 is output as the latch trigger CP2 through an inverter IV12.

As shown in FIG. 100, the first internal clock signal CKF is changed from the low level to the high level in synchronization with the change of the main clock signal CLK from the low level to the high level. The discharge of the load capacitance C of the first load wiring RPLML is started in accordance with the high level of the first internal clock signal CKF. When the level of the first load wiring RPLML exceeds the logical threshold value of the inverter IV13, the second internal clock signal CKR is changed from the low level to the high level. The discharge of the load capacitance C of the second load wiring BACKML is started in accordance with the high level of the second internal clock signal CKR. The output of the inverter IV14 is of the low level. When the level of the second load wiring BACKML exceeds the logical threshold value of the OR circuit OR11, the reset signal RST is changed from the high level to the low level. Accordingly, the latch trigger CP2 is changed from the low level to the high level. Further, the first internal clock signal CKF that is the output of the set/reset latch RSLT is changed from the high level to the low level. Accordingly, the reset signal RST is changed from the low level to the high level, and the latch trigger CP2 is changed from the high level to the low level.

The characteristics of the circuit of FIG. 10B are as follows.
(a) The main clock signal CLK is received by the set/reset latch RSLT.
(b) The output of the set/reset latch RSLT is sequentially delayed by the CKF, the RPLML, the CKR, and the BACKML. The first load wiring RPLML and the second load wiring BACKML are arranged in parallel with the match line ML.
(c) The reset signal RST of the set/reset latch RSLT is output from the OR logic (the OR circuit OR11 is provided) between the second load wiring BACKML and the first internal clock CKF immediately after the output of the set/reset latch RSLT.

In the above (c), it is important that the reset signal RST is output from not only the second load wiring BACKML but also the OR logic between the second load wiring BACKML and the first internal clock CKF. If the OR logic is not provided, the reset period of the set/reset latch RSLT becomes too long, and the operation frequency of the TCAM becomes slow. The operation frequency of the TCAM can be increased by shortening the path of the reset signal RST as compared to the BACKML.

Next, the first test terminal TE1 and the second test terminal TE2 will be described.

The first test terminal TE1 and the second test terminal TE2 can be used in the following manner. In the first test terminal TE1, test screening of the TCAM cell with a weak driving force can be performed by generating the match line output latch trigger CP2 at a high speed. Further, in the second test terminal TE2, the match line output latch trigger CP2 is generated at a low speed. In the general search operation of the TCAM, whether the match line ML is extracted to "L" (mismatch) after the match line ML is precharged to "H" or the match line ML is floated in the "H" state (match) is latched by the latch circuit LT in the match amplifying unit. Thus, generation of a leak current or the like causes a malfunction because the floated match line ML cannot maintain the "H" level. An increase in the leak current is one of defects that frequently occur in actual use, and it is desirable to perform screening in advance in the shipping test. In the second test terminal TE2, the output latch trigger CP2 is delayed to prolong the period of time of the floating state of the match line ML. Accordingly, if a small leak current is generated, defects can be detected, and highly-reliable screening can be conducted.

According to the configuration, it is possible to produce the optimum match line output timing adopted for a compiler. Further, since the optimum match line output timing can be generated, the high speed of the TCAM macro cell can be realized. Furthermore, the quality and reliability of the TCAM macro cell can be improved by the screening test.

Fourth Modified Example

Figure 11:
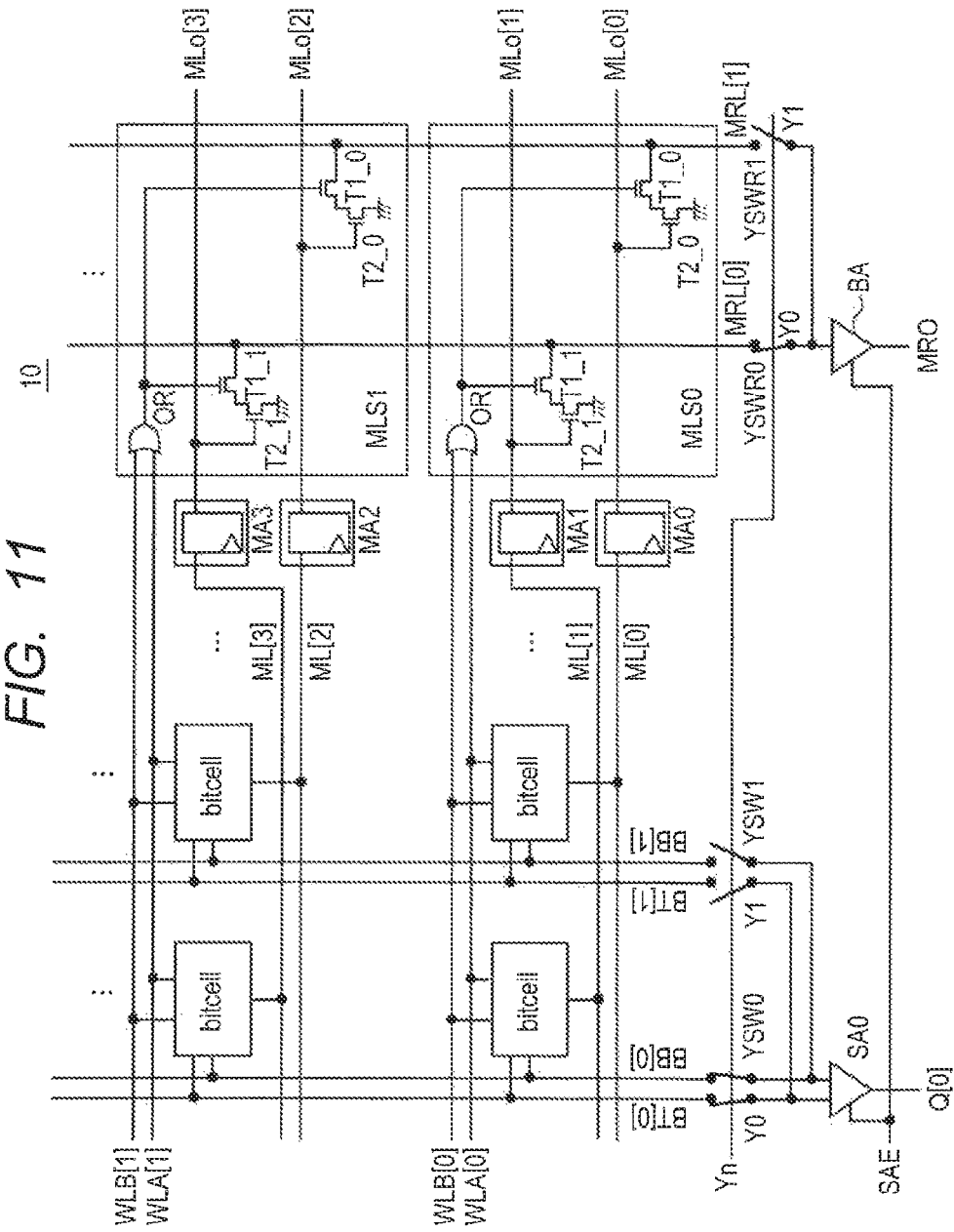
FIG. 11 is a circuit diagram for conceptually showing a TCAM macro cell according to a fourth modified example.

FIG. 11 is a circuit diagram for conceptually showing a TCAM macro cell according to a fourth modified example. The TCAM macro cell of FIG. 11 is configured to be capable of selecting a pair of bit lines BT[0] and BB[0] or a pair of bit lines BT[1] and BB[1] by a Y selection signal (column selection signal) Yn. In the case where the Y selection signal Yn is Y0, a Y switch YSW0 is turned on, and the pair of bit lines BT[0] and BB[0] is coupled to a sense amplifier SA0. On the other hand, in the case where the selection signal Yn is Y1, a Y switch YSW1 is turned on, and the pair of bit lines BT[1] and BB[1] is coupled to the sense amplifier SA0.

Further, according to the change, the match reading lines MRL are changed to a first match reading line MRL[0] and a second match reading line MRL[1]. In the case where the Y selection signal Yn is Y0, a Y switch YSWR0 is turned on, and the first match reading line MRL[0] is coupled to a buffer amplifier BA. On the other hand, in the case where the Y selection signal Yn is Y1, a Y switch YSWR1 is turned on, and the second match reading line MRL[1] is coupled to the buffer amplifier BA.

Further, according to the change, the configurations of the match line selection circuits MLS0 and MLS1 are changed. The match line selection circuit MLS0 has N-channel MOS transistors T1_0 and T2_0 for reading the output (match signal output line MLo[0]) of a match amplifier MA0 to the second match reading line MRL[1] and N-channel MOS transistors T1_1 and T2_1 for reading the output (match signal output line MLo[1]) of a match amplifier MA1 to the first match reading line MRL[0]. Further, as similar to the above, the match line selection circuit MLS1 has N-channel MOS transistors T1_0 and T2_0 for reading the output (match signal output line MLo[2]) of a match amplifier MA2 to the second match reading line MRL[1] and N-channel MOS transistors T1_1 and T2_1 for reading the output (match signal output line MLo[3]) of a match amplifier MA3 to the first match reading line MRL[1]. The other configurations are the same as those of the example. The fourth modified example can be applied to the example and the first to third modified examples.

According to the configuration, even in the case of the configuration in which the pair of bit lines and the match reading lines MRL are selected by the Y selection signal, the effect same as that obtained in the example can be obtained.

Fifth Modified Example

Figure 12:
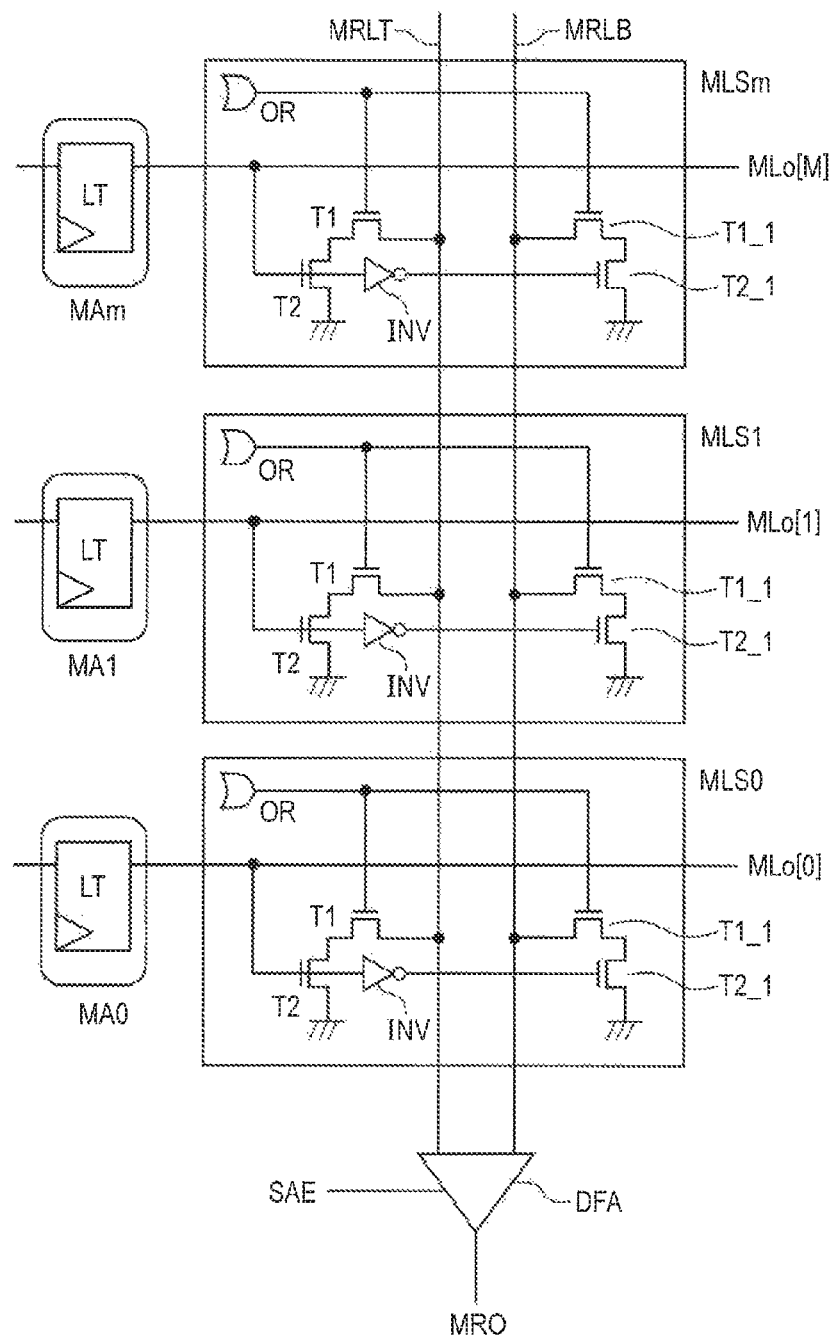
FIG. 12 is a diagram for showing an example of a configuration of a match line selection circuit MLS according to a fifth modified example.

FIG. 12 is a diagram for showing an example of a configuration of a match line selection circuit MLS according to a fifth modified example. The match line selection circuit MLS of FIG. 12 is configured in such a manner that a match reading signal MR0 can be read by a differential amplifier DFA, and the reading of the match reading signal MR0 can be stabilized or made faster. This configuration can be applied to the example and the first to fourth modified examples.

The match reading lines (MRL) are changed to a first match reading line MRLT and a second match reading line MRLB, and the first match reading line MRLT and the second match reading line MRLB are coupled to the input of the differential amplifier DFA.

According to the change, a match line selection circuit MLS0 has N-channel MOS transistors T1 and T2 for reading the output of a match amplifier MA0 to the first match reading line MRLT, and an inverter INV and N-channel MOS transistors and T2_1 and T2_1 for reading the output of the match amplifier MA0 to the second match reading line MRLB. The gates of the N-channel MOS transistors T1 and T1_1 are coupled to the cutout of an OR circuit OR. The OR circuit OR is the one of the match line selection circuit MLS0 shown in FIG. 5. The gate of the N-channel MOS transistor T2 is coupled to a match signal output line MLo[0], and the gate of the N-channel MOS transistor T2_1 is coupled to the match signal output line MLo[0] through the inverter INV. Match line selection circuits MLS1 and MLSm have the same configuration as that of the match line selection circuit MLS0.

According to this configuration, the reading of the match reading signal MR0 can be stabilized and made faster.

[Application]

Figure 13:
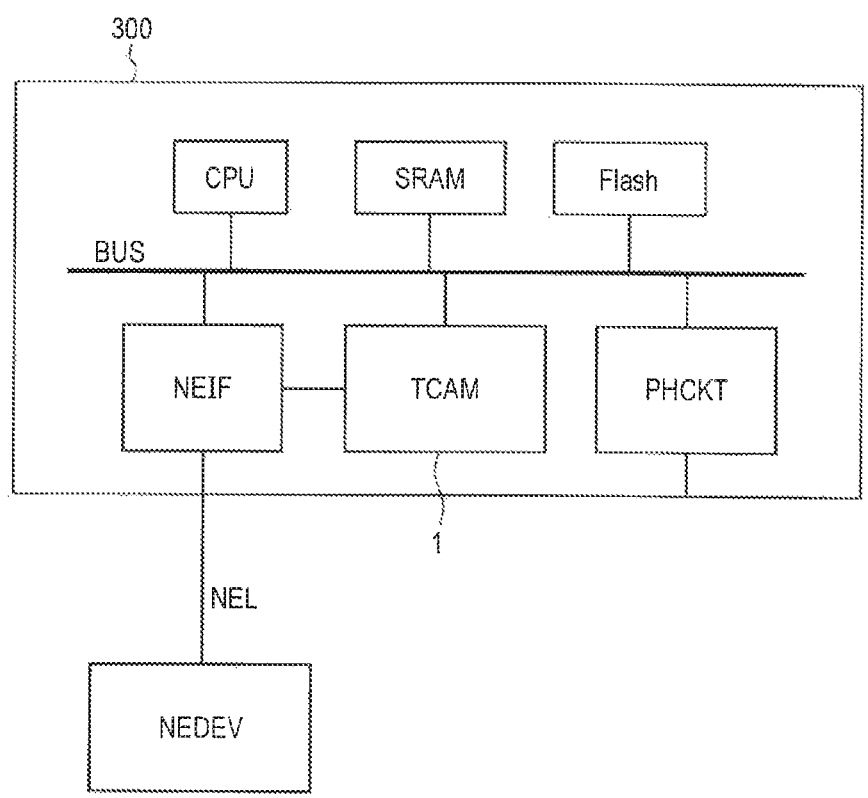
FIG. 13 is a conceptual block diagram of a semiconductor device according to an application.

FIG. 13 is a conceptual block diagram of a semiconductor device according to an application.

A semiconductor device 300 has a central processing unit CPU, a static random access memory SRAM that is a volatile memory, a flash memory Flash as a non-volatile memory, a network interface circuit NEIF, a TCAM device 1, a peripheral circuit PHCKT, and a bus BUS. The static random access memory SRAM is used as a working area of the CPU. The flash memory Flash stores therein a program of the central processing unit CPU. The CPU, the SRAM, the Flash, the NEIF, the TCAM device 1, and the PHCKT are mutually coupled to each other through the bus BUS. The network interface circuit NEIF communicates with a network device NEDEV provided outside the semiconductor device 300 through a network line NEL. The network interface circuit NEIF is also coupled to the TCAM device 1. The TCAM device 1 includes a TCAM 10 and a priority encoder PREN. The configurations of the example and the first to fifth modified examples can be applied to the TCM 10. The TCAM device 1 receives communication packets supplied from the network device NEDEV to the network interface circuit NEIF through the network line NEL, and performs routing of the communication packets and the like.

The invention achieved by the inventors has been concretely described above on the basis of the embodiment and the example. However, it is obvious that the present invention is not limited to the above-described embodiment and example, and can be variously changed.

What is claimed is:

1. A content addressable memory comprising:
   a plurality of ternary content addressable memory (TCAM) cells;
   a first word line and a second word line coupled to the TCAM cells;
   a plurality of bit lines coupled to the TCAM cells;
   a plurality of search lines coupled to the TCAM cells;
   a match line coupled to the TCAM cells;
   a match amplifier coupled to the match line; and
   a selection circuit that selects an output of the match amplifier in accordance with a value of the first word line or the second word line.

2. The content addressable memory according to claim 1, further comprising:
   a match signal output line to which the output of the match amplifier is supplied; and
   a reading line,
   wherein the selection circuit includes:
     an OR circuit having an input coupled to the first word line and the second word line;
     a first Metal Oxide Semiconductor (MOS) transistor having a gate coupled to an output of the OR circuit; and
     a second MOS transistor having a gate coupled to the match signal output line, and
   wherein a source-drain route of the first MOS transistor and a source-drain route of the second MOS transistor are coupled in series between the reading line and a reference potential.

3. The content addressable memory according to claim 1, further comprising a scan input circuit that is coupled to the search lines to supply test search data to the search lines.

4. The content addressable memory according to claim 1, further comprising:
   a match signal output line to which the output of the match amplifier is supplied; and
   a reading line,
   wherein the selection circuit includes:
     a first Metal Oxide Semiconductor (MOS) transistor having a gate coupled to the first word line; and
     a second MOS transistor having a gate coupled to the match signal output line, and
   wherein a source-drain route of the first MOS transistor and a source-drain route of the second MOS transistor are coupled in series between the reading line and a reference potential.

5. A content addressable memory comprising:
   a plurality of ternary content addressable memory (TCAM) cells;
   a first word line and a second word line coupled to the TCAM cells;
   a plurality of bit lines coupled to the TCAM cells;
   a plurality of search lines coupled to the TCAM cells;
   a match line coupled to the TCAM cells;
   a match amplifier coupled to the match line; and
   a scan input circuit that supplies test search data to the search lines.

6. The content addressable memory according to claim 5, further comprising a plurality of search line drivers coupled to the search lines, wherein the scan input circuit includes a plurality of flip flop circuits that supplies the test search data to the search line drivers.

7. The content addressable memory according to claim 6, further comprising a plurality of writing drivers coupled to the bit lines,
wherein the outputs of the flip flop circuits are coupled to the inputs of the search line drivers and the inputs of the writing drivers.

8. A content addressable memory comprising:
a plurality of ternary content addressable memory (TCAM) cells;
a plurality of word lines including a first word line and a second word line coupled to the TCAM cells;
a plurality of bit lines coupled to the TCAM cells;
a plurality of search lines coupled to the TCAM cells;
a plurality of match lines coupled to the TCAM cells; and
a match amplifying unit coupled to the match lines,
wherein the match amplifying unit includes a plurality of latch circuits and a plurality of selection circuits,
wherein each of the selection circuits includes a first input coupled to the corresponding match line and a second input coupled to the output of the corresponding latch circuit,
wherein the latch circuits and the selection circuits configure a scan path between a scan input terminal and a scan output terminal, and
wherein the selection circuit outputs the output of the corresponding latch circuit to a reading line in accordance with a selection level of the first word line or the second word line.

9. The content addressable memory according to claim 8, further comprising:
a match line selection circuit unit coupled to the first word line, the second word line, and the outputs of the latch circuits; and
the reading line,
wherein the match line selection circuit unit includes a plurality of selection circuits coupled to corresponding first word line and a second word line and the outputs of the corresponding latch circuits, and
wherein each of the selection circuits outputs the output of the corresponding latch circuit to the reading line in accordance with the selection level of the corresponding word line.

10. The content addressable memory according to claim 9,
wherein each of the selection circuits includes:
an OR circuit having an input coupled to the first word line and the second word line;
a first Metal Oxide Semiconductor (MOS) transistor having a gate coupled to the output of the OR circuit; and
a second MOS transistor having a gate to which the output of the corresponding latch circuit is supplied, and
wherein a source-drain route of the first MOS transistor and a source-drain route of the second MOS transistor are coupled in series between the reading line and a reference potential.

11. The content addressable memory according to claim 9, further comprising a scan input circuit that is coupled to the search lines to supply test search data to the search lines.

12. The content addressable memory according to claim 11, further comprising a plurality of search line drivers coupled to the search lines,
wherein the scan input circuit includes a plurality of flip flop circuits that supplies the test search data to the search line drivers.

* * * * *